(12) United States Patent
Uno

(10) Patent No.: US 7,692,471 B2
(45) Date of Patent: Apr. 6, 2010

(54) SWITCHED-CAPACITOR CIRCUIT HAVING TWO FEEDBACK CAPACITORS

(75) Inventor: Masayuki Uno, Ina (JP)

(73) Assignee: Linear Cell Design Co., Ltd., Nagano-Ken (JP)

(*) Notice: Subject to any disclaimer, the term of this patent is extended or adjusted under 35 U.S.C. 154(b) by 0 days.

(21) Appl. No.: 12/355,508

(22) Filed: Jan. 16, 2009

(65) Prior Publication Data
US 2009/0185406 A1   Jul. 23, 2009

(30) Foreign Application Priority Data
Jan. 22, 2008   (JP) .............................. 2008-011046

(51) Int. Cl.
*H03K 5/00* (2006.01)
(52) U.S. Cl. .............................. 327/337; 327/94; 330/9
(58) Field of Classification Search ................... 327/94, 327/554, 337; 330/9; 333/9
See application file for complete search history.

(56) References Cited

U.S. PATENT DOCUMENTS

| 4,644,291 A | * | 2/1987 | Masuda | ....................... 330/261 |
| 5,142,238 A | * | 8/1992 | White | ........................... 330/9 |
| 6,778,009 B1 | * | 8/2004 | Lee | .............................. 330/9 |

OTHER PUBLICATIONS

Masuda, et al. "CMOS sampled differential, push pull cascode operational amplifier," Proceedings of the International symposium on Circuits and Systems, Montral, Canada, pp. 1211-1214, May 1984.

Allen, et al. "CMOS Analog Circuit Design," Second Edition, Oxford University Press, New York, pp. 376-378, 2002.

Kapusta, et al. "A 14b 74MS/s CMOS AFE for True High-Definition Camcorders," 2006 IEEE International Solid-State Circuits Conference, vol. XLIX, Feb. 2006.

Worapishet, et al. "Efficient Mismatch-Insensitive Track-and-Hold Circuit Using Low-Voltage Floating-Gate MOS Transistors," IEICE Trans. Electron., vol. E88-C, No. 6, pp. 1148-1153, Jun. 2005.

Uno, et al, "An offset compensated class-AB sample-and-hold amplifier using two sampling capacitors," IEICE Electronics Express, vol. 5, No. 22, pp. 962-966, Nov. 2008.

* cited by examiner

*Primary Examiner*—Dinh T. Le
(74) *Attorney, Agent, or Firm*—Cook Alex Ltd.

(57) ABSTRACT

A switched-capacitor circuit performing two-phase operation with a sampling phase and an amplification phase comprising: an inverter having a common source type input transistor and a load transistor; a first capacitor whose first terminal is connected to a gate of the input transistor serving as an input of the inverter; a first switch which connects between the input (the gate of the input transistor) and the output of the inverter, which turns on during the sampling phase and turns off during the amplification phase; a second switch which connects a second terminal of the first capacitor to an input voltage terminal during the sampling phase, and connects the second terminal of the first capacitor to the output terminal of the inverter during the amplification phase; a second capacitor whose first terminal is connected to a gate of the load transistor of the inverter and whose second terminal is connected to the second terminal of the first capacitor; and a third switch which connects the first terminal of the second capacitor to a bias voltage terminal during the sampling phase, and turns off the first terminal of the second capacitor from the bias voltage during the amplification phase.

5 Claims, 15 Drawing Sheets

Sampling phase

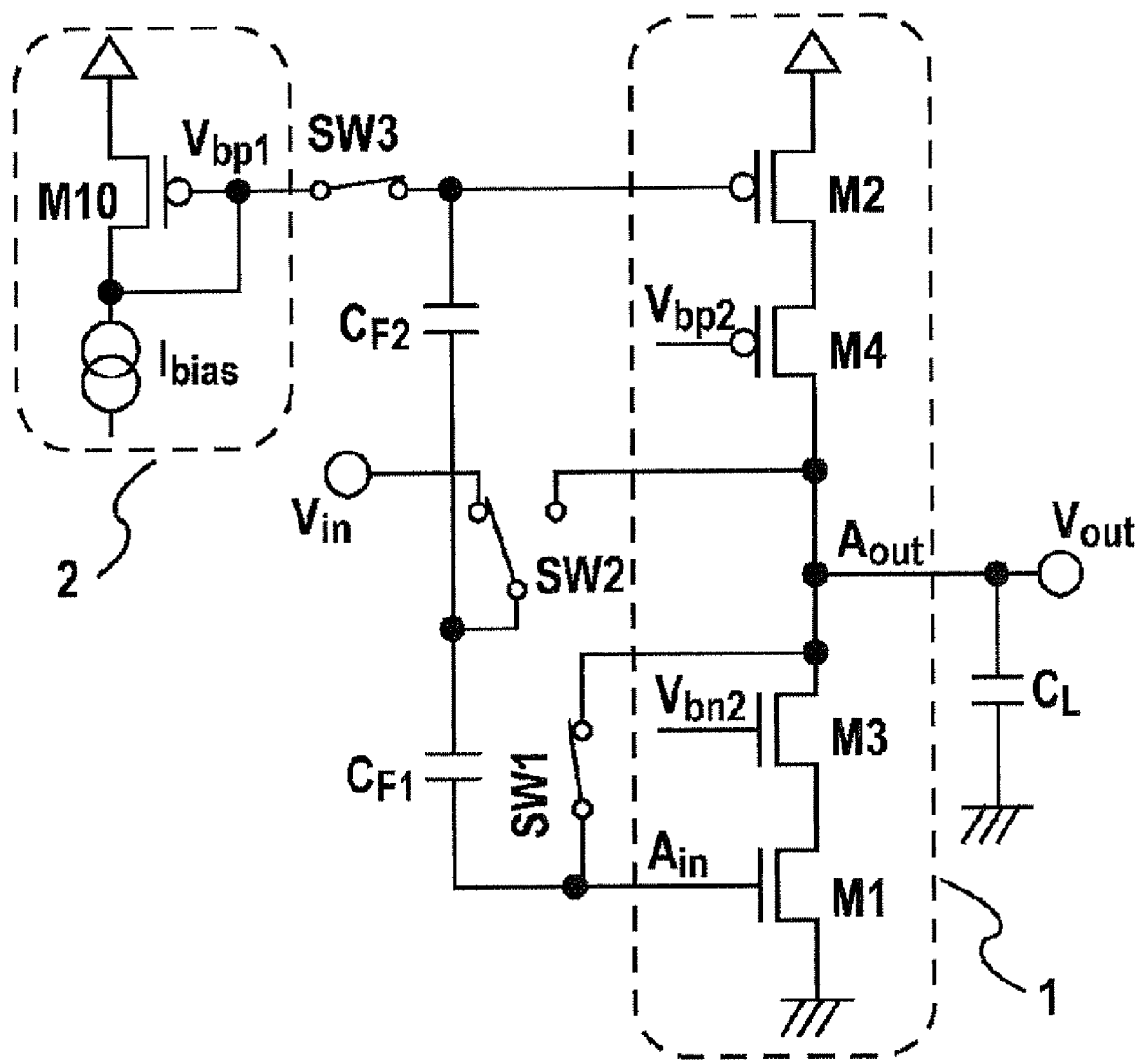
FIG. 1A Sampling phase

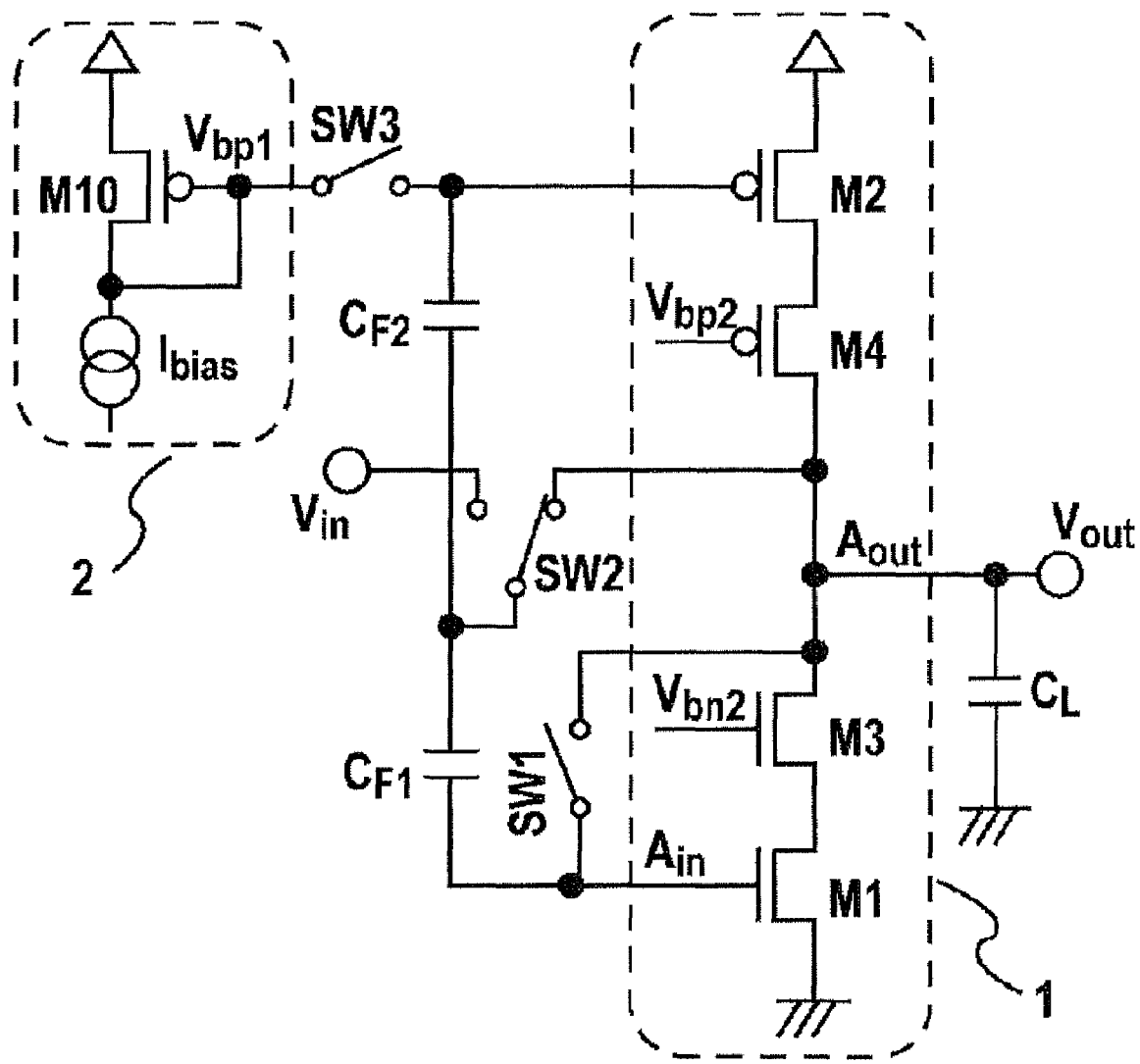
FIG. 1B Amplification phase

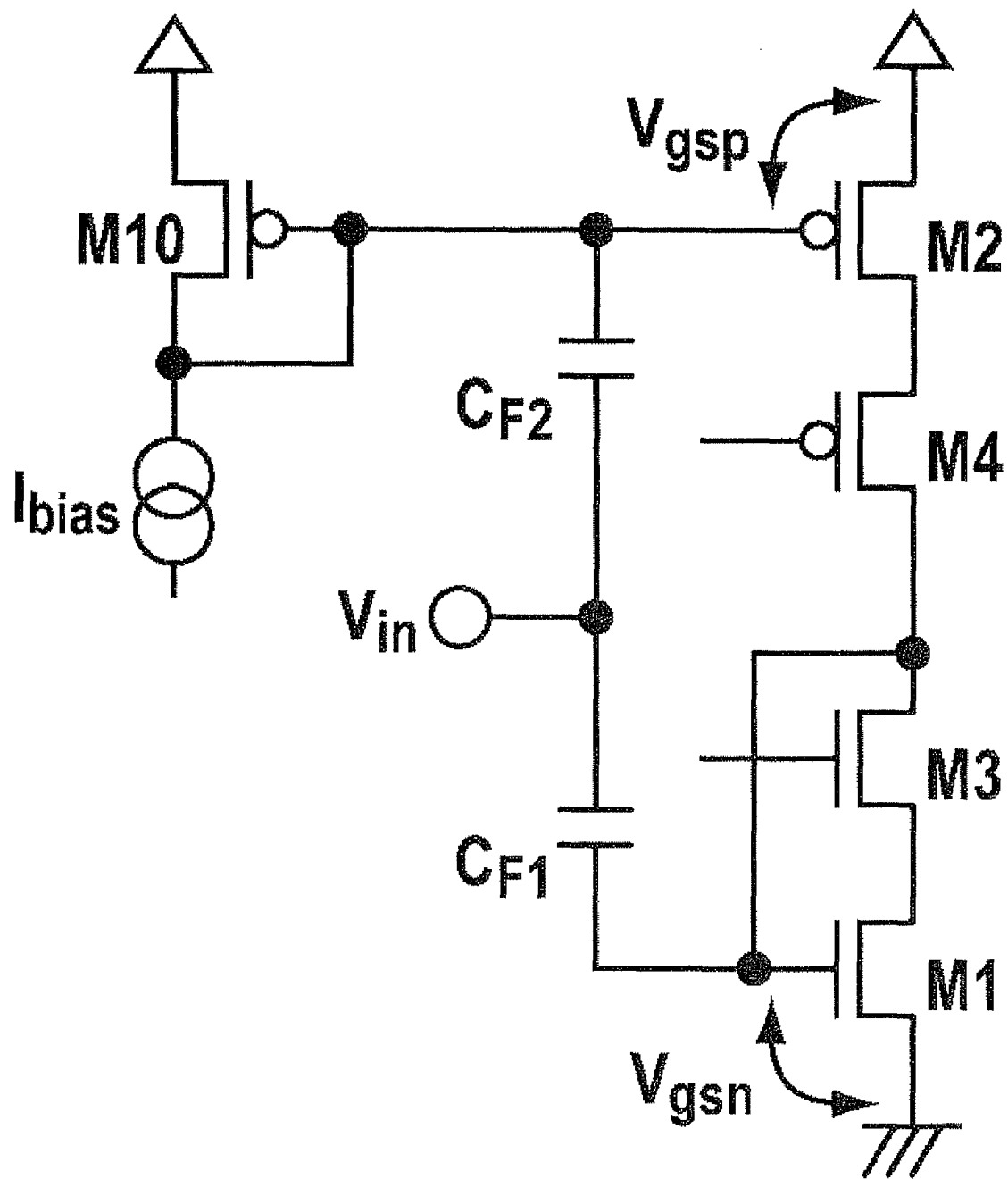
FIG.2A Sampling phase

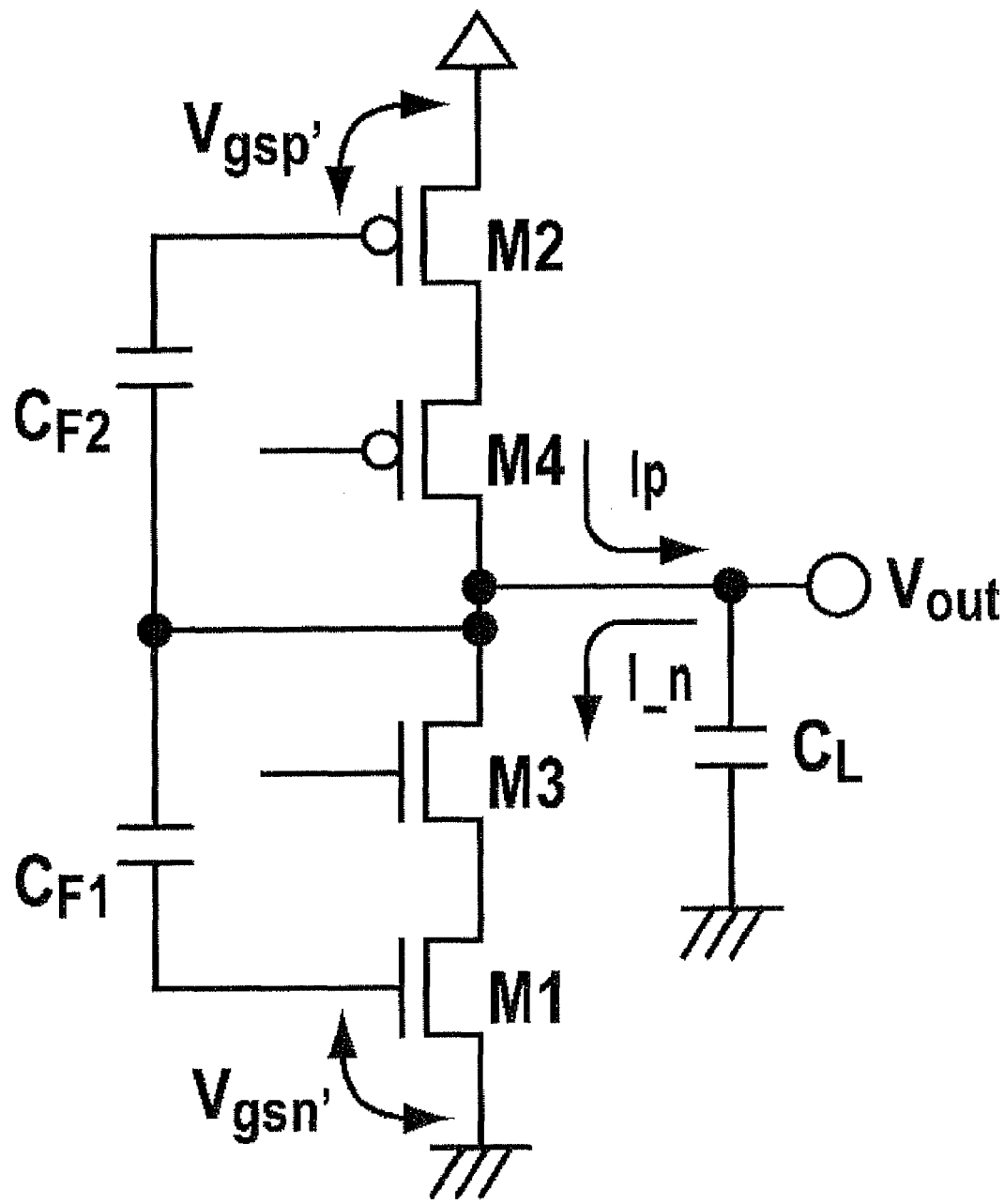
FIG. 2B Amplification phase

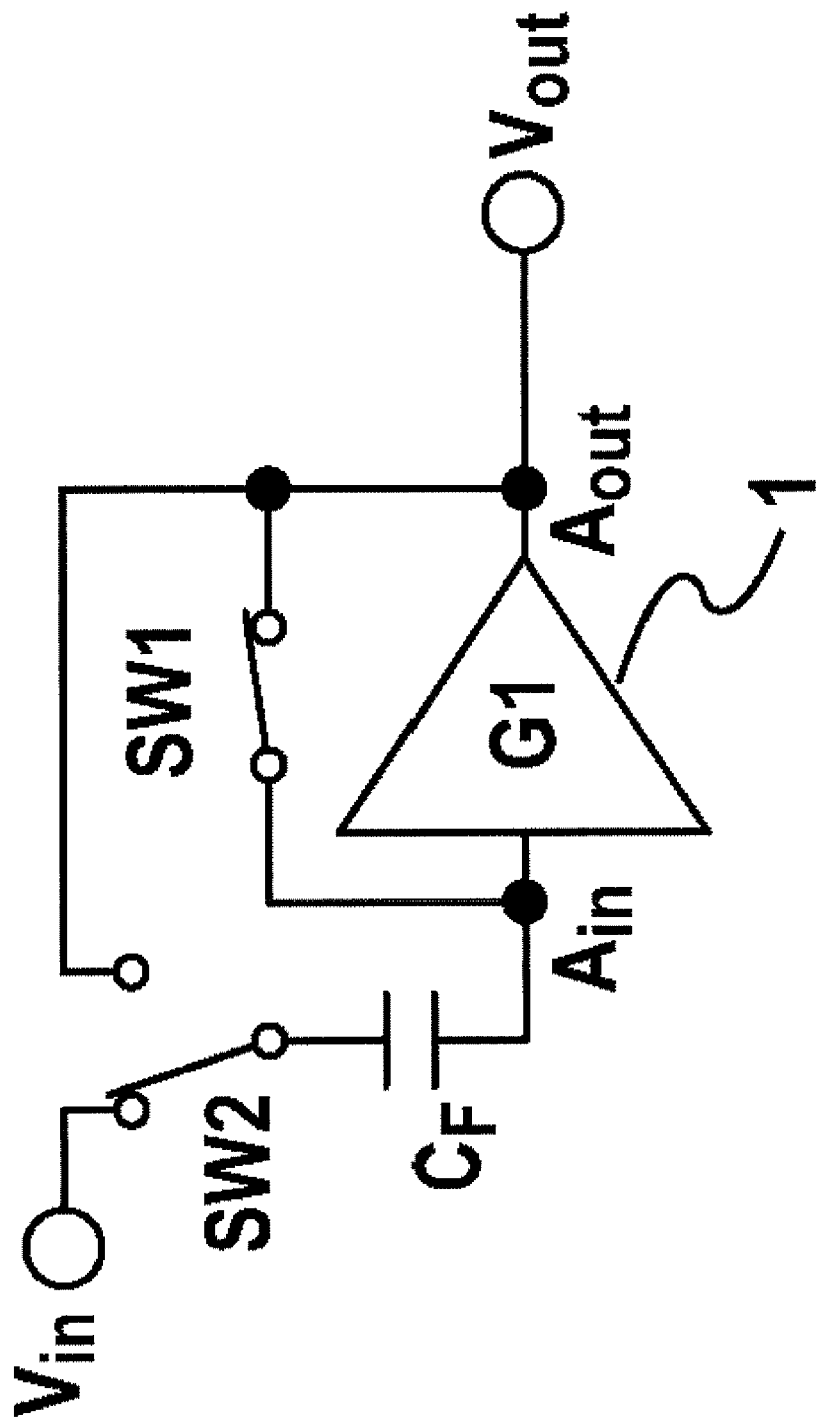
FIG. 8A PRIOR ART Sampling phase

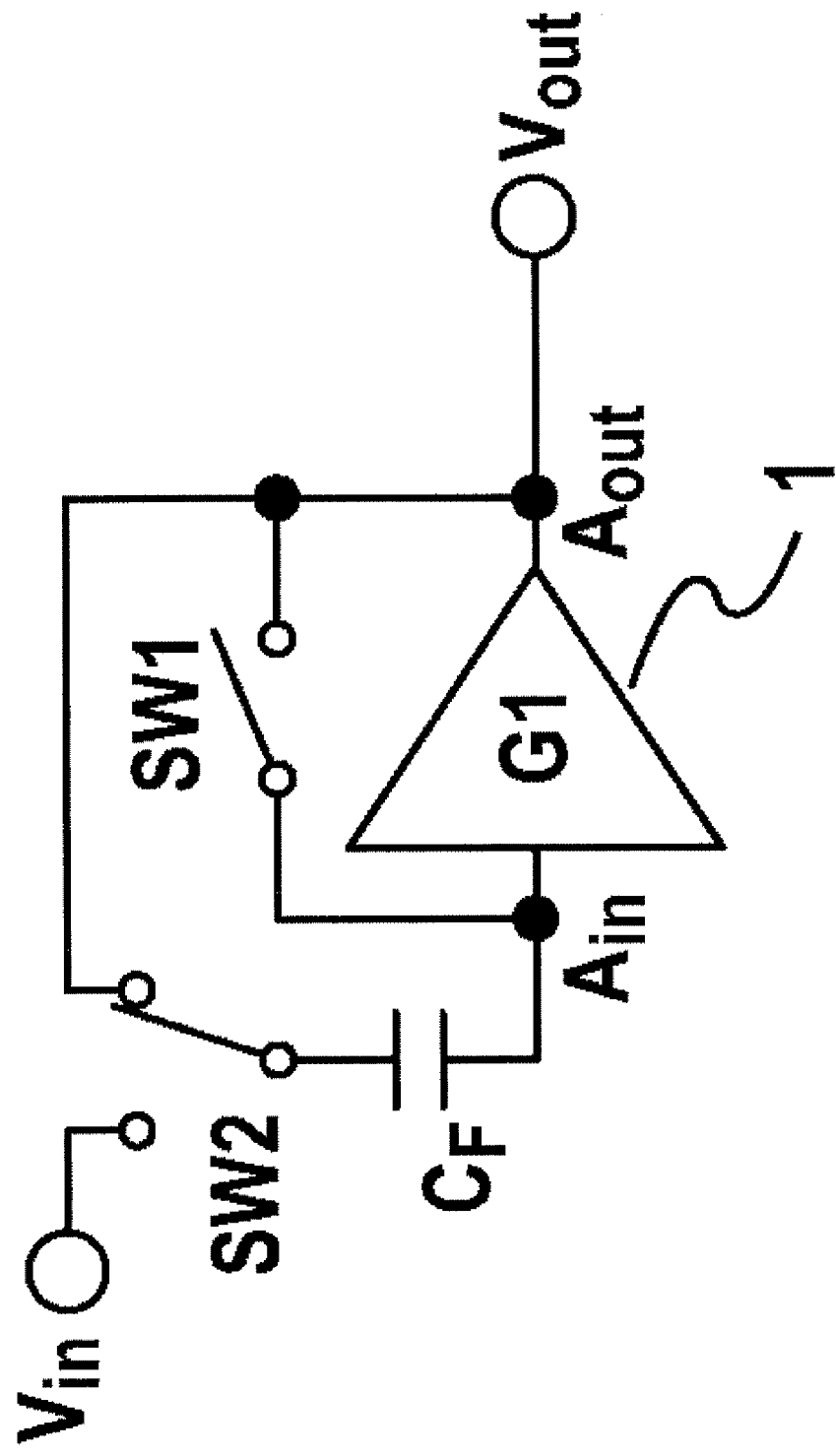
FIG. 8B PRIOR ART Amplification phase

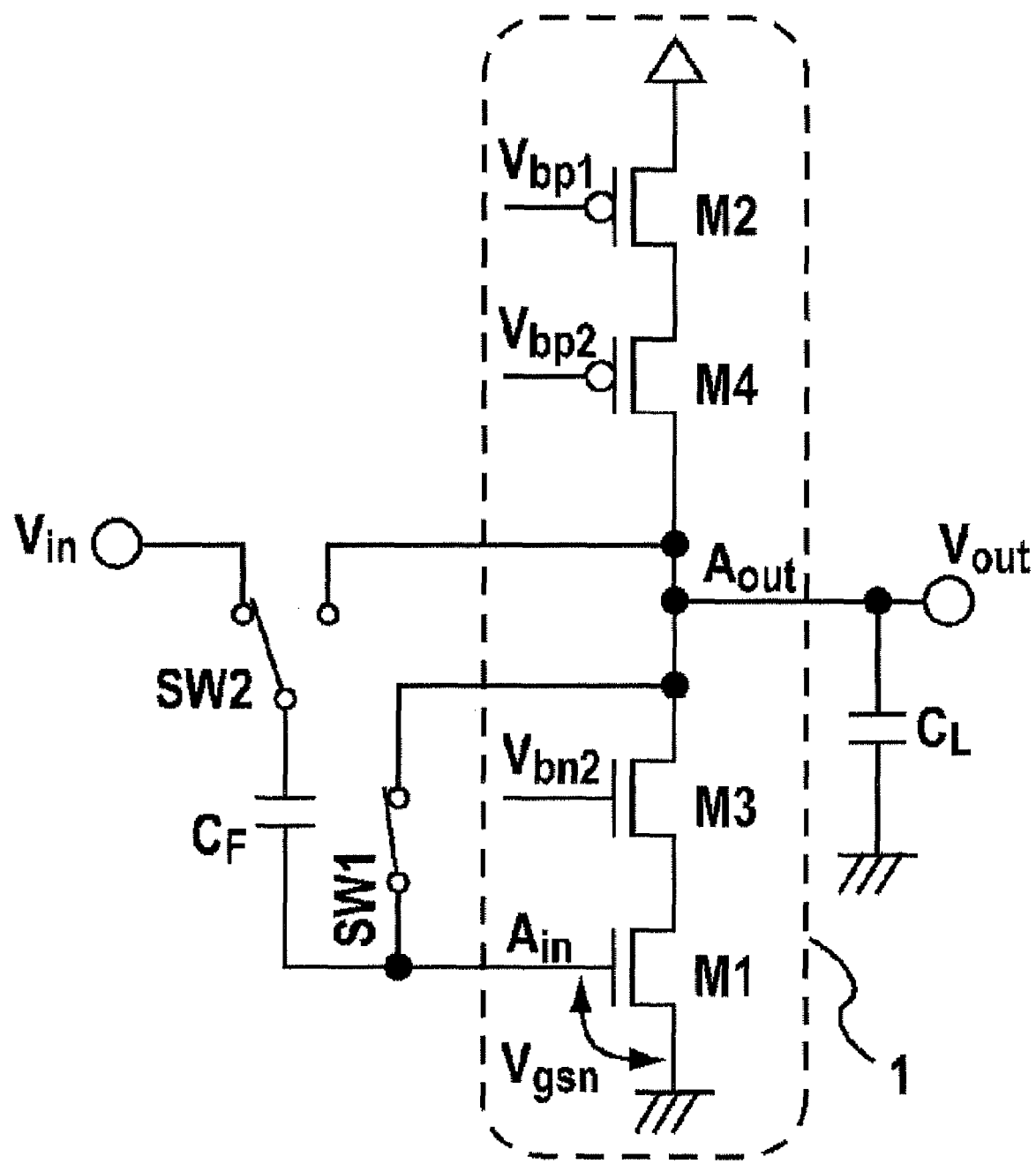
FIG. 9A Sampling phase

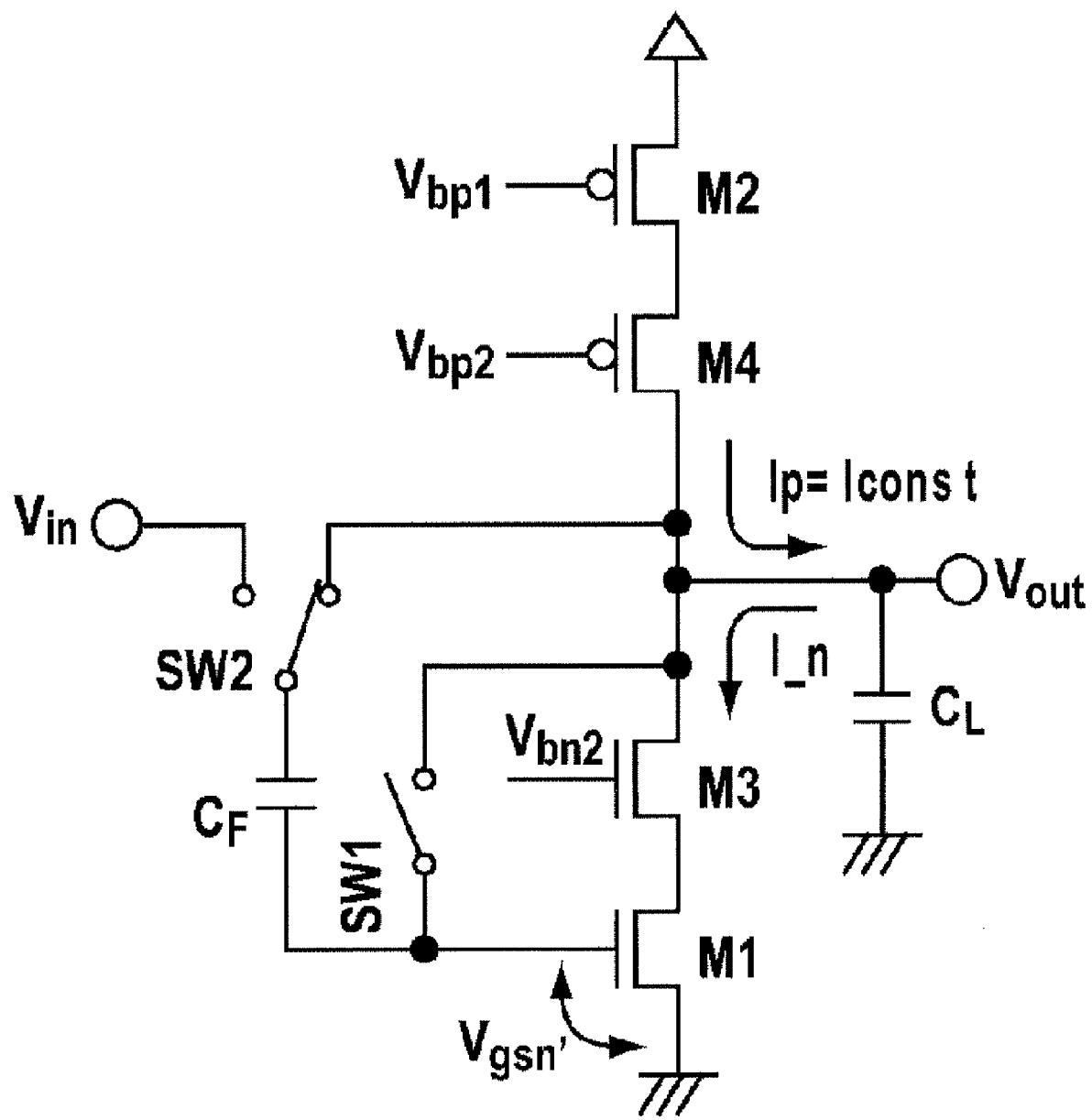
FIG. 9B Amplification phase

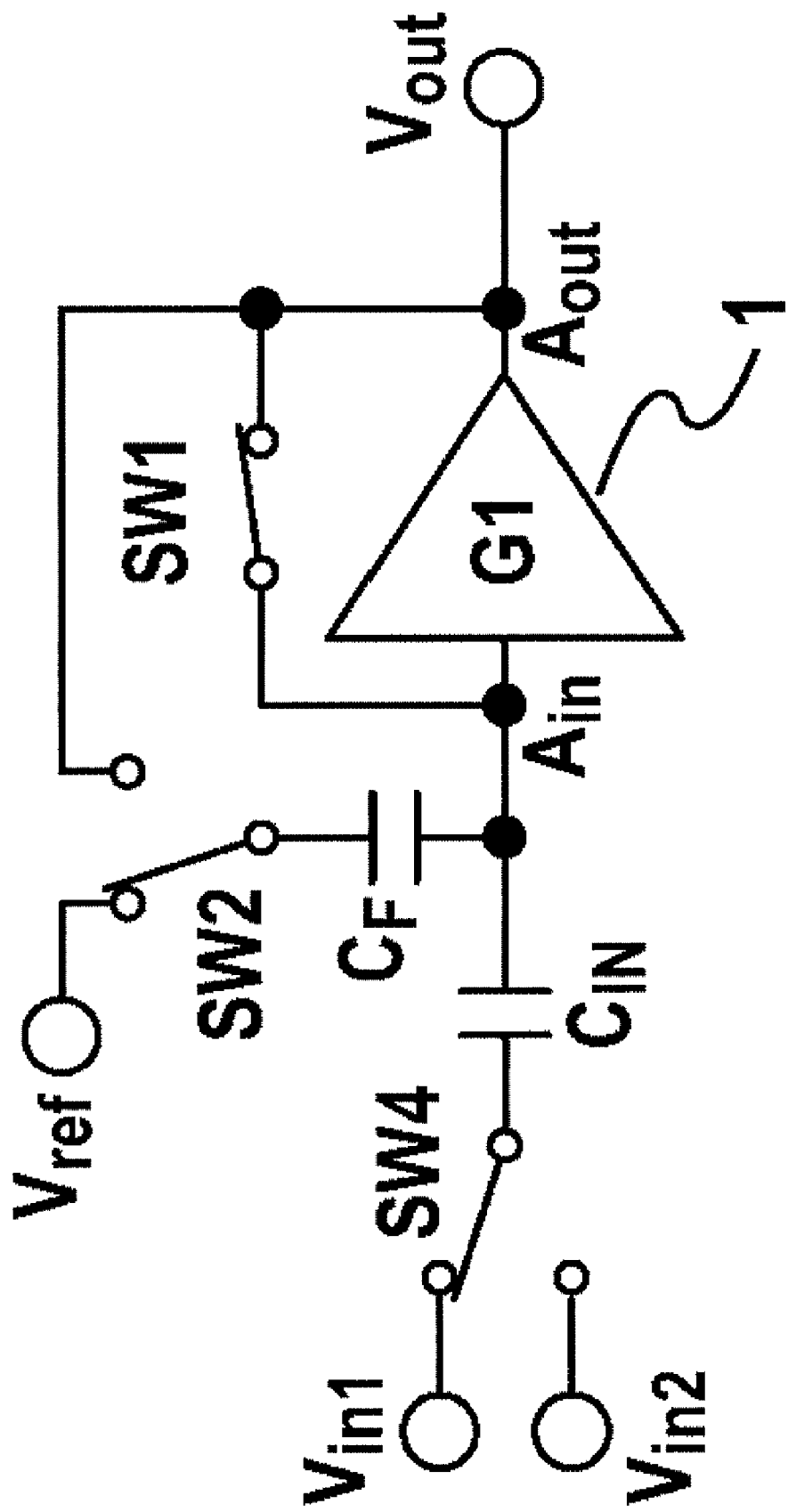
FIG.10A Sampling phase

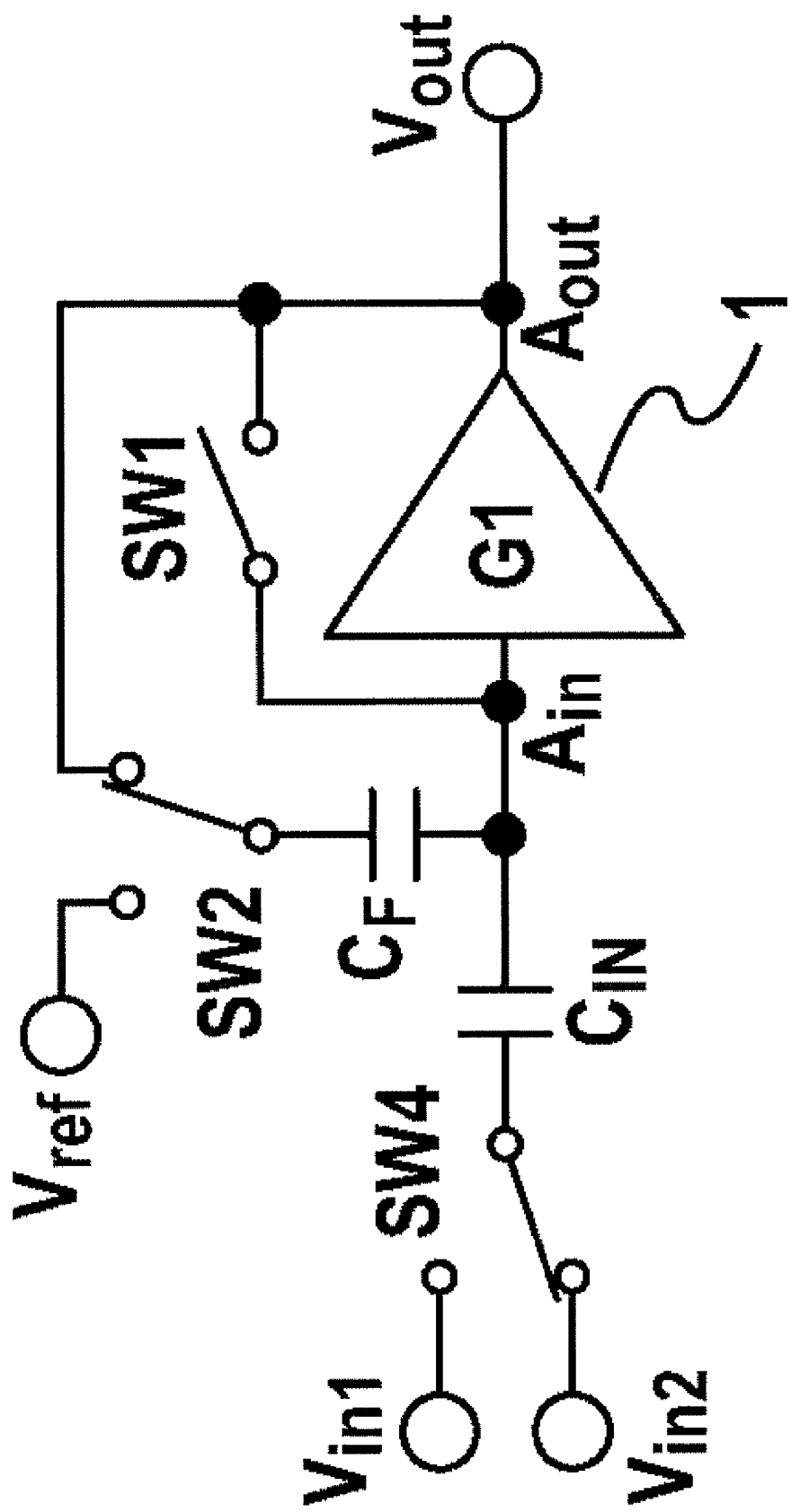
FIG.10B Amplification phase

SWITCHED-CAPACITOR CIRCUIT HAVING TWO FEEDBACK CAPACITORS

CROSS-REFERENCE TO RELATED APPLICATION

This patent application claims priority to Japanese patent application No. 2008-011046, filed on Jan. 22, 2008.

TECHNICAL FIELD

The present invention relates to a switched-capacitor circuit composed of CMOS (Complementary Metal Oxide Semiconductor) devices, and in particular, to a basic circuitry structure which can realize a low-power and high-speed amplifier circuits, such as a sample-and-hold amplifier or an inverting charge amplifier, and can also apply to a digital-to-analog converter or an analog-to-digital converter.

BACKGROUND OF THE INVENTION

One of the most popular approaches for realizing analog signal processing in CMOS integrated circuits is through the use of a switched-capacitor circuit which operates as a discrete-time signal processor. As one typical circuit example thereof, there is a sample-and-hold amplifier shown in FIG. 8. This circuit has a structure shown in many books for reference, including "Analog MOS Integrated Circuits for Signal Processing" written by Rubik Gregorian, Gabor C. Temes published by A Wiley-interscience Publication (John Wiley & Sons, Inc.) pp 416-417 (1986). This sample-and-hold amplifier is composed of an inverter (inverting amplifier) 1 with open-loop gain G1, a switch SW1 provided between an input and an output of the inverter, a feedback capacitor CF whose one end is connected to an inverter input terminal Ain, and a switch SW2 which is connected to the other end of the feedback capacitor CF and selectively connects the feedback capacitor to an input terminal for providing an input voltage Vin or an inverter output terminal Aout. The inverter output terminal Aout is directly connected to an output terminal for providing an output voltage Vout.

The sample-and-hold amplifier operates in two-phases of a sampling phase and an amplification phase. During the sampling phase, the sample-and-hold amplifier is in a state of FIG. 8A, in which the switch SW1 is in an ON-state, the switch SW2 is connected to the input signal voltage Vin, and the signal voltage Vin is sampled in the feedback capacitor CF. During the amplification phase, as shown in FIG. 8B, the each switch is turned into the inversion state from those on the sampling phase respectively, and the feedback capacitor CF is connected between the input and output of the inverter, and then, the output signal voltage Vout is obtained. The output signal voltage Vout at this time comes to Vout=Vin for the following reason when the open-loop gain G1 of the inverter 1 is sufficiently high.

Given that the open-loop gain of the inverter is G1, a feedback loop is formed between the input and output of the inverter during both the sampling phase and the amplification phase, the deviation of input voltage at the inverter input terminal Ain comes to 1/G1 with respect to the deviation of output voltage Vout. Accordingly, when G1 is extremely high, the voltage of the amplifier input terminal Ain hardly changes, which can be considered as a so-called "virtual ground state". In this way, when the voltage at the inverter input terminal Ain does not change, the voltage at the other end of the capacitor does not change, which comes to Vout=Vin, because the electric charge in the capacitor CF is conserved in accordance with the charge conservation law. Accordingly, the input voltage Vin sampled on the sampling phase is held as the inverter output in the following amplification phase. This type of sample-and-hold amplifier has the feature that it is possible to obtain an output signal which is free of the influence of a threshold voltage or an offset voltage of the inverter.

Next, one example in which the inverter 1 of FIG. 8 is replaced with a concrete structure is shown in FIG. 9. The inverter 1 is composed of a common source (source-grounded) NMOS (Negative channel Metal Oxide Semiconductor) input transistor M1 whose gate serves as the inverter input terminal Ain, a PMOS (Positive channel Metal Oxide Semiconductor) load transistor M2 operating as a constant current source whose gate is connected to a bias voltage Vbp1, an NMOS transistor M3 cascode-connected to the NMOS transistor M1, in which a bias voltage Vbn2 is applied to its gate, and a PMOS transistor M4 cascode-connected to the PMOS transistor M2, in which the bias voltage Vbp2 is applied to its gate. The transistors M3 and M4 are provided in order to increase the drain resistances of the transistors M1 and M2, respectively, and not essential components for the inverter. However, the transistors M3 and M4 are generally used in a CMOS analog circuit in order to raise the gain of the inverter.

SUMMARY OF THE INVENTION

With reference in FIG. 9A and FIG. 9B, the problem in the above sample-and-hold amplifier is pointed out through how the output voltage Vout during the amplification phase is settled into a steady state of Vout=Vin. During the sampling phase shown in FIG. 9A, the output voltage Vout comes to a source-gate voltage Vgsn of the NMOS transistor M1, that is, Vout=Vgsn, and a voltage of Vin−Vgsn is sampled in the capacitor CF because the gate of the NMOS transistor M1 and the inverter output terminal Aout are short-circuited. At this time, the PMOS transistor M2 supplies a constant current Iconst according to the gate voltage Vbp1, and in a steady state, the current flowing in the NMOS transistor M1 as well comes to Iconst.

Next, during the amplification phase shown in FIG. 9B, the switch SW1 is turned off and the capacitor CF is connected between the input and output of the inverter to operate as a feedback capacitor, which comes to Vout=Vin in a steady state. However, when the voltages are in a state of Vout>Vin in a transient state immediately after switching from the sampling phase, because the voltage of Vin−Vgsn is conserved in the capacitor CF, a gate voltage Vgsn' of the NMOS input transistor M1 is higher than Vgsn in a steady state, which comes to Vgsn'>Vgsn, and a current I_n in the NMOS input transistor M1 comes to be greater than the current Iconst in a steady state. At this time, because a current Ip in the PMOS load transistor M2 is a constant current, that is Ip=Iconst because its gate is fixed to the bias voltage Vbp1, which comes to I_n>Ip, a sink current of I_n-Ip is generated to discharge a load capacitance CL connected to the output terminal. In contrast thereto, in the transient state of Vout<Vin, I_n<Ip generates a source current of Ip-I_n to charge the load capacitance CL. Note that, the state of Vout>Vin is a transient state in which an output waveform falls down during the amplification phase, and the state of Vout<Vin is a transient state in which an output waveform rises up during the amplification phase.

In this way, in the transient state within the amplification phase, the current Ip of the PMOS transistor M2 is constant, that is Ip=Iconst. However, the current I_n of the NMOS transistor M1 changes by ΔI_n from that in a steady state, which comes to I_n=Iconst+ΔI_n. The ΔI_n is corresponding to the gate voltage deviation ΔVgsn of the NMOS input transistor M1 and transconductance gmn, which is expressed as equation (1). Further, ΔVgsn is caused by the connecting the feedback capacitor CF in which the voltage of Vin−Vgsn is held, to the load capacitance at the output voltage Vout and transferring a differential voltage Vout−Vin to the gate of the input transistor M1. However, because the electric charge is distributed to a parasitic capacitance or the like, ΔVgsn comes to be less than the voltage of Vout−Vin, and the effect can be expressed as the equation (1) by using a feedback factor β(0<β<1).

$$\Delta In = \Delta Vgsn * gmn = \beta *(Vout-Vin)* gmn \qquad (1)$$

The load capacitance CL is charged or discharged so as to be Vout=Vin by the deviation current ΔI_n generated due to feedback being applied to the input transistor M1, which performs a settling operation. The greater the difference between Vout and Vin is, the longer the time for the settling operation is. As is realized from the equation (1), because the greater the differential voltage Vout−Vin is, the higher the current to be generated is, in a case in which Vout>Vin and ΔI_n is positive, i.e., at fall, even when a difference between Vout and Vin is large in an initial state, the voltages are settled into a steady state of Vout=Vin within a relatively short time.

However, when an output waveform rises up (hereinafter at rise) in a case in which the initial state is Vout<Vin, the current (In=Iconst+ΔI_n) of the input transistor M1 does not come to a negative value. Therefore, the current ΔI_n to charge the load capacitance CL does not come to be greater than or equal to the constant current Iconst of the PMOS transistor M2, which is limited to ΔI_n>−Iconst. Where ΔI_n of a negative means source current. Accordingly, when the initial state is Vout<Vin, that is at rise, and a difference between Vout and Vin is large, the source current does not come to be greater than Iconst differently from that at fall (when an output waveform fall down in a case in which the initial state is Vout>Vin), which results in the operation at a so-called slew rate region. Therefore, a settling time at rise is extremely longer than at fall. In order to avoid this problem, it requires larger bias current Iconst in a steady state, which causes the higher power consumption.

In this way, in a switched-capacitor circuit using a so-called class-A amplifier composed of an input transistor of a common source configuration and a load transistor operating as a constant current source, a response of charging using with the constant current circuit is made slower than a response of charging using input transistor, because feedback is applied to only a gate voltage of the input transistor. This problem causes a difficulty to raise a sampling frequency because the settling time is restricted by the slewing characteristics of a constant current.

The problem in the switched-capacitor circuit having a conventional structure has been described above by using the sample-and-hold amplifier shown in FIGS. 8 and 9 However, the problem is not only caused in the sample-and-hold amplifier, but also in the inverting charge amplifier circuit shown in FIG. 10.

FIG. 10 shows the structure in which an input capacitor CIN whose one end is connected to an inverter input terminal Ain, and a switch SW4 which is connected to the other end thereof, that switches an input signal between a sampling phase and the amplification phase, are added to the same structure as the sample-and-hold amplifier in FIG. 8. As shown in the drawing, given that a voltage to be applied to the feedback capacitor CF during a sampling phase is a reference voltage Vref, the output voltage Vout in a steady state during the amplification phase is expressed as the equation (2), and an inverting signal of a deviation Vin2−Vin1 in the input signal voltage is output during the amplification phase by using the reference voltage Vref as a reference.

$$Vout = Vref - (Vin2 - Vin1) * CIN/CF \qquad (2)$$

In this inverting charge amplifier circuit structure, because feedback is applied to only the input transistor of the inverter 1 via the feedback capacitor CF, a settling time limited by a slewing characteristic of a constant current source, is made slower in the same way as in the sample-and-hold amplifier of FIG. 8, and one of a rising characteristic and a falling characteristic in a large output swing is made slower, which makes it difficult to shorten a sampling cycle without increasing a bias current.

In consideration of the above problems in the conventional structure, one of the objects of the present invention is to realize a high-speed settling characteristic without increasing bias current of a switched-capacitor circuit including an inverter having an input transistor and a load transistor as basic components, and a capacitor which is connected between the input and the output of the inverter as a feedback capacitor during the amplification phase. In particular, an object of the present invention is to realize a switched-capacitor circuit, which is capable of achieving a high-speed settling time at both rise and fall in a large output swing.

In order to solve the above-described problem, the following means are used in the present invention. That is, a switched-capacitor circuit performing two-phase operation with a sampling phase and an amplification phase includes, an inverter having an input transistor (M1) and a load transistor (M2); a first capacitor whose first terminal is connected to a gate of the input transistor (M1) serving as an input of the inverter; a first switch which connects between the input (the gate of the input transistor) and the output of the inverter, which turns on during the sampling phase and turns off during the amplification phase; a second switch which connects a second terminal of the first capacitor to an input voltage terminal during the sampling phase, and connects the second terminal of the first capacitor to the output terminal of the inverter during the amplification phase; a second capacitor whose first terminal is connected to a gate of the load transistor (M2) of the inverter and whose second terminal is connected to the second terminal of the first capacitor; and a third switch which connects the first terminal of the second capacitor to a bias voltage terminal during the sampling phase, and turns off the first terminal of the second capacitor from the bias voltage during the amplification phase.

In this way, by newly providing the second capacitor and the third switch, the load transistor of the inverter operates as a constant current source by a bias voltage to the gate terminal of the load transistor during a sampling phase. However, because the gate terminal of the load transistor is cut off from the bias voltage and feedback from the output terminal is applied through the second capacitor during the amplification phase, the gate voltages of not only the input transistor, but also the load transistor change according to an output voltage, which makes driving current increase. Therefore, in a case in which the load capacitance is charged or discharged using the load transistor's current, high-speed charging and discharging can be realized in the same way as in the case of the input transistor. Thus, a high-speed settling time can be realized at both rise and fall, which makes it possible to achieve the object of the present invention.

In the present invention, by connecting the input of the inverter and the first terminal of the first capacitor to the output terminal of the inverter during the sampling phase, a voltage including an offset voltage of the inverter is applied to the first terminal of the first capacitor and is sampled thereby during the sampling phase. Therefore, the offset voltage of the inverter is cancelled during the amplification phase, and it is possible to obtain an offset-free output voltage.

In order to apply the present invention to the inverting charge amplifier circuit shown in FIG. 10, it is recommended that the following structure be added thereto and an input voltage at the input terminal of the structure is replaced as a reference voltage. That is, the switched-capacitor circuit further includes a third capacitor having a first terminal connected to the first terminal of the first capacitor, a fourth capacitor having a first terminal connected to the first terminal of the second capacitor, and a fourth switch which connects second terminals of the third capacitor and the fourth capacitor in common to a first input voltage terminal during the sampling phase, and to a second input voltage terminal during the amplification phase. Thus, an inverting charge amplifier circuit of a fast settling time at both rise and fall can be realized.

The present invention can be also applied to a weighted mean sample-and-hold circuit. In this case, the fourth switch may be configured as follows in the above-described inverting charge amplifier circuit. That is, the second input voltage terminal to be connected during the amplification phase by the fourth switch is changed to an output terminal of the inverter. In accordance with the structure of the fourth switch, a weighted mean voltage of two input voltages with coefficients of capacitance ratios, which is a sampling capacitance and a total capacitance, can be output during the amplification phase. Therefore, this switched-capacitor circuit as well is capable of realizing a fast settling time at both rise and fall.

The present invention can be applied to a non-inverting charge amplifier circuit which executes non-inverting amplification of a signal input, which is used for a pipeline analog-to-digital converter and others. In this case, the fourth switch as a component of the inverting charge amplifier circuit can be configured as follows. That is, second terminals of the third capacitor and the fourth capacitor are connected in common to the input voltage terminal during the sampling phase, and are connected in common to a ground terminal or a reference voltage terminal during the amplification phase by the fourth switch. Thus, an output signal formed by non-inverting amplification of an input signal can be obtained. This circuit structure as well is capable of realizing a fast settling time at both rise and fall.

Further, the present invention can be also applied to a fully differential circuit with two inputs and two outputs. In this case, the following means are used. That is, the first capacitors, the second capacitors, the first switches, the second switches, and the third switches are respectively provided in two pairs, and a fully differential structure with two inputs and two outputs, internally having a common-mode feedback circuit, is used as the fully differential amplifier. Thus, it is possible to realize a switched-capacitor circuit such as a fully differential sample-and-hold amplifier or an inverting charge amplifier. In the fully differential configuration, when one of the outputs rises up, the other one falls down, and therefore, settling times at both rise and fall are always faster than that of the conventional structure.

In case that the second (feedback) capacitor to be connected to the gate of the load transistor of the fully differential amplifier is further provided and the gate terminal thereof is disconnected from the bias voltage during the amplification phase, feedback from the output (terminal) is applied to, not only the input transistor, but also the load transistor. Therefore, the current to charge or discharge the load capacitance using the load transistor is increased, which makes a high-speed settling time possible. Further, even in a large output swing, the slow operation in the slew rate region in which a driving current at rise or fall is limited by a constant current, does not occur. Therefore, it is possible to realize a fast settling characteristic at both rise and fall even in a large output swing.

BRIEF DESCRIPTION OF THE DRAWINGS

FIG. 1A is a circuit diagram showing operating state during a sampling phase of a sample-and-hold amplifier, that is a first embodiment of a switched-capacitor circuit to which the present invention is applied, FIG. 1B is a circuit diagram showing operating state during an amplification phase of the sample-and-hold amplifier, that is a first embodiment of a switched-capacitor circuit to which the present invention is applied, FIG. 2A is a circuit diagram showing operating state during the sampling phase for explanation of basic operations in FIG. 1A, FIG. 2B is a circuit diagram showing operating state during the amplification phase for explanation of basic operations in FIG. 1B, FIG. 8 is a block diagram showing a sample-and-hold amplifier in a conventional switched-capacitor circuit, FIG. 9 is a circuit diagram showing circuit having a concrete structure in which the inverter shown in FIG. 8 is embodied, and FIG. 10 is a block diagram showing an inverting charge amplifier circuit in the conventional switched-capacitor circuit.

DETAILED DESCRIPTION OF THE PREFERRED EMBODIMENTS

First Embodiment

Figure 3:
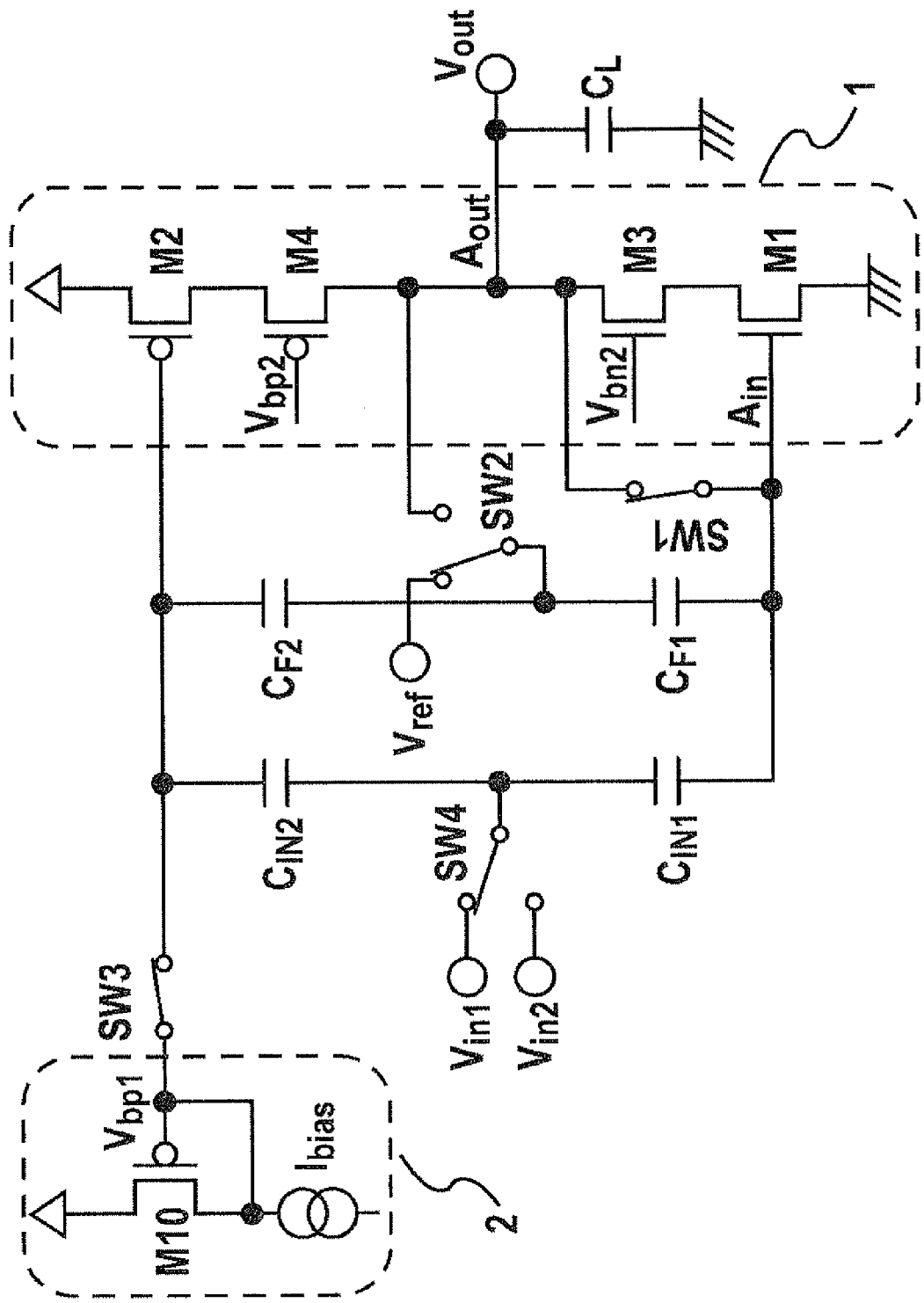
FIG. 3 is a circuit diagram showing an inverting charge amplifier circuit, that is a second embodiment of the switched-capacitor circuit to which the present invention is applied.

FIG. 1 shows a switched-capacitor circuit indicated as a first embodiment in which the present invention is applied to a conventional sample-and-hold amplifier shown in FIG. 9. In FIG. 1, components, which are corresponding to those in FIG. 9 are provided with the same reference numbers or symbols. As shown in FIG. 1, the basic structures of an inverter (inverting amplifier) 1, a switch SW1 (first switch) which is provided between an input terminal Ain and an output terminal Aout of the inverter, a feedback capacitor CF1 (first capacitor) whose one end (first terminal) is connected to the inverter input terminal Ain, and a switch SW2 (second switch) which is connected to the other end (second terminal) of the feedback capacitor CF1, and which is connected to an input signal terminal (input voltage terminal) to be supplied with an input voltage Vin during a sampling phase, and is connected to the inverter output terminal Aout during an amplification phase, are the same as those shown in FIG. 9. Further, in the same way as shown in FIG. 9, the structure of the inverter 1 is composed of a common source NMOS input transistor M1 whose gate is the inverter input terminal Ain, a PMOS load transistor M2 whose gate is connected to a bias voltage Vbp1, which operates as a constant current source, an NMOS transistor M3 which is cascode-connected to the NMOS transistor M1 and in which a bias voltage Vbn2 is applied to its gate, and a PMOS transistor M4 which is cascode-connected to the PMOS transistor M2 and in which a bias voltage Vbn2 is provided to its gate. The both transistors M3 and M4 are provided in order to increase the drain resistances of the transistors M1 and M2.

The present invention is characterized by that a feedback capacitor CF2 and a switch SW3 are newly added to the conventional structure of FIG. 9. One end (a first terminal) of the feedback capacitor CF2 (second capacitor) is connected to the gate of the PMOS load transistor M2 in the inverter 1 and the other end (a second terminal) thereof is connected to a terminal (second terminal) at the side of the switch SW2 of the feedback capacitor CF1 (first capacitor). The switch SW3 (third switch) is provided between the gate of the PMOS load transistor M2 and a bias circuit 2 which supplies the bias voltage Vbp1 (a voltage at the bias voltage terminal) thereto, and the switch SW3 disconnects the gate of the load transistor M2 from the bias circuit 2 during the amplification phase. Note that, an actual circuit example as a bias circuit at the bias voltage Vbp1 has not been illustrated in FIG. 9, however, as shown in FIG. 1, the bias circuit 2 can be composed of a circuit in which a constant current of Ibias is connected to a PMOS transistor M10 whose gate-to-drain is short-circuited. By using the structure as described above, when the switch SW3 is turned on, a current mirror is comprised of the PMOS transistors M10 and M2, and the PMOS transistor M2 operates as a constant current source.

The operations during the respective phase shown in FIG. 1 will be described with reference to FIG. 2 which shows only connection states. FIG. 2A shows a state during the sampling phase, and the PMOS load transistor M2 and PMOS transistor M10 comprising a current mirror, and a bias current of the inverter flowing through M2 is regulated by the current mirror. A source-gate voltage of the PMOS transistor M2 at this time is expressed as Vgsp. Further, the gate-to-drain of the NMOS input transistor M1 is short-circuited via the NMOS cascode transistor M3, and a source-gate voltage at this time is expressed as Vgsn. When the input signal voltage Vin (a voltage at the input voltage terminal) is applied to the capacitors CF1 and CF2, a voltage Vin−Vgsn is sampled in the capacitor CF1, and a voltage Vin−Vgsp is sampled in the capacitor CF2.

During the amplification phase, the switches SW1 and SW3 in FIG. 1 are turned off and a common terminal of the capacitors CF1 and CF2 is connected to the inverter output terminal Aout, which is a state shown in FIG. 2B. At this time, a source-gate voltage of the PMOS load transistor M2 is expressed as Vgsp' and a source-gate voltage of the NMOS input transistor M1 is expressed as Vgsn'. In a steady state, given that the gain of the inverter 1 is G1, amounts of changes Vgsp−Vgsp' and Vgsn−Vgsn' in the gate voltages are 1/G1 of the deviation of the output voltage. Therefore, when the gain G1 is enough high, Vgsn=Vgsn' and Vgsp=Vgsp', and Vout=Vin is output from the charge conservation law. Accordingly, the structure shown in FIG. 1 is not different functionally from the conventional structure of FIG. 9, and the input signal voltage Vin input during the sampling phase is made to be an amplified output Vout=Vin during the amplification phase, which does not include an offset voltage.

Next, the reason that a settling time is made faster will be described hereinafter showing a current in a transient state during the amplification phase in this circuit structure. In a case of a voltage Vout of the load capacitance CL is less than Vin, that is Vout>Vin, the gate-source voltage Vgsn' of the NMOS input transistor M1 in a transient state immediately after the sampling phase is switched to the amplification phase is made greater than the Vgsn in a steady state, because the voltage Vin−Vgsn is stored in the input capacitor CF1, and then a current I_n of the input transistor M1 in a transient state increases by ΔI_n from a bias current Iconst in a steady state, which results in I_n=Iconst+ΔI_n. On the other hand, in a case of Vout>Vin, the gate-source voltage Vgsp' of the load transistor M2 in a transient state is made less than the Vgsp in a steady state, because the voltage of Vin−Vgsp is stored in the capacitor CF2, and a current Ip of the load transistor M2 in a transient state decreases by a current of ΔIp from the bias current Iconst in a steady state, which results in Ip=Iconst−ΔIp. This results in a difference between I_n and Ip and therefore, the difference serves as a sink current of the inverter to discharge the load capacitance CL. The differential current is I_n−Ip=ΔI_n+ΔIp, which is expressed by a sum of a current increment ΔI_n of the input transistor and a current decrement ΔIp of the load transistor.

These ΔI_n and ΔIp can be derived in the same way as equation (1), which are expressed as equations (3) and (4). Where ΔVgsn, gmn, ΔVgsp and gmp respectively denote gate voltage deviations, transconductances of the NMOS input transistor M1 and the PMOS load transistor M2, and βn and βp respectively denote feedback factors toward the NMOS input transistor M1 and the PMOS load transistor M2.

$$\Delta I\_n = \Delta Vgsn * gmn = \beta n * (Vout - Vin) * gmn \quad (3)$$

$$\Delta Ip = \Delta Vgsp * gmp = \beta p * (Vout - Vin) * gmp \quad (4)$$

A current to discharge or charge the load capacitance CL is ΔI_n+ΔIp, which is expressed as equation (5) by using equations (3) and (4). In comparison of equation (5) with equation (1), when it is assumed that the feedback factor βn is approximately equal to the feedback factor β in equation (1), a current expressed by equation (5) is made larger by an amount of a contribution of the term of βp*gmp. This means that a charging/discharging current for the load capacitance CL in the circuit structure of FIG. 1 is made larger than that in the conventional structure of FIG. 9 even under the same bias current condition, which leads to shortening of a settling time. Thus, the structure in FIG. 1 which is the modified sample-and-hold amplifier of FIG. 9 can realize a faster settling characteristic without increasing the bias current Iconst in a steady state.

$$\Delta I\_n + \Delta Ip = (\beta n * gmn + \beta p * gmp) * (Vout - Vin) \quad (5)$$

Further, the sample-and-hold amplifier of FIG. 9 has had the problem that, in a large swing operation with a large difference between Vin and Vout under the condition of Vout<Vin, that is performed at rise on which the output voltage is rising up, a negative current of ΔI_n to charge the capacitance CL is limited by ΔI_n>−Iconst, with a slewing behavior, which an absolute value of a source current is less than Iconst, which makes the transient speed at rise extremely slow. Here, a current to charge the load capacitance CL at the lower limit of ΔI_n=−Iconst in equation (5) is derived as ΔI_n+ΔIp=−Iconst−βp*gmp*(Vin−Vout). Where the source current has a negative value, the equation (5) denotes that the absolute value of the second term thereof is made higher in accordance with a differential voltage Vin−Vout. This means that an absolute value of ΔI_n+ΔIp is made higher in accordance with a difference between Vin and Vout even at rise in large swing operation with a large difference between Vin and Vout, and the rising behavior can also have a relatively fast settling characteristic by the equation (5) in the same as at fall, on which the output voltage is falling down.

Considering how the currents I_n and Ip fluctuate in FIG. 2B, it can be understood that ΔI_n+ΔIp has no upper and lower limit. When there is a differential voltage Vout−Vin in the transient state due to the fact that output signal is feedback to not only the gate terminal of the input transistor M1, but also the gate terminal of the load transistor M2 by the feedback capacitors CF1 and CF2, the both gate voltages fluctuate from those in a steady state. In a case of Vout>Vin at fall, I_n increases and Ip decreases because Vgsn' increases and Vgsp' decreases. By contrast, in a case of Vout<Vin at rise, I_n decreases and Ip increases because Vgsn' decreases and Vgsp' increases.

In this way, the currents I_n and Ip fluctuate in opposite polarity to one another. On the other hand, a charging/discharging current for the load capacitance CL is I_n−Ip, that is a differential current between the currents I_n and Ip. Here, a sink current in a case of Vout>Vin and Ip=0 is I_n, which comes to I_n=Iconst+ΔIn. As is clear from equation (3), ΔI_n increases in proportion to Vout−Vin, and therefore, there is no upper limit to I_n in a case of Vout>Vin. Further, a source current in case of Vout<Vin and I_n=0, is −Ip, and the negative sign thereof means the source current. Here, considering the absolute value of the current Ip in an easy-to-understand manner, it is Ip=Iconst−ΔIp, and it can be modified into Ip=Iconst+βp*gmp*(Vin−Vout) by using equation (4). It is shown that the second term in this equation increases in proportion to a differential voltage Vin−Vout under the condition of Vout<Vin, and therefore, it is clear that there is no upper limit to the absolute value of Ip in a case of Vout<Vin. In this way, when one of the currents I_n and Ip becomes 0, that means the minimum value, the other current increases in proportion to a differential voltage between Vout and Vin. As mentioned above, there is no upper limit to both of a charging current and a discharging current, which are not restricted to the constant current in the circuit structure shown in FIG. 1, differently from the circuit structure shown in FIG. 9. Therefore, the circuit structure shown in FIG. 1 can realize a fast settling time at both rise and fall in a large output swing.

As described above with reference to FIGS. 1 and 2, in the sample-and-hold amplifier to which the present invention is applied, a charging/discharging current generated by a differential voltage Vout−Vin between the input voltage Vin which is input during a sampling phase and the output voltage Vout from the load capacitance CL connected to the output signal terminal, is ΔI_n+ΔIp. In comparison with the conventional circuit, the sample-and-hold amplifier to which the present invention is applied, can realize a high-speed settling time without increasing bias current in a steady state, that is the object of the present invention because charging/discharging current increases due to the current deviation of the PMOS load transistor M2. Further, ΔI_n increases in proportion to a differential voltage Vout−Vin at fall, and ΔIp increases in proportion to a differential voltage Vin−Vout at rise even in the large output swing, which leads to non-slewing behavior in any case, a fast settling time is possible at both rise and fall.

Second Embodiment

An embodiment in which the present invention is applied to an inverting charge amplifier circuit shown in FIG. 10, which has input capacitor CIN, is shown as a second embodiment in FIG. 3, and the operation thereof will be described. In FIG. 3, components, which are the same as those in FIG. 1 are provided with same reference numbers or symbols. FIG. 3 is a structure in which two input capacitors CIN1 (a third capacitor) and CIN2 (a fourth capacitor) whose one ends are connected in common, and a changeover switch SW4 (a fourth switch) that connects the connection points of those capacitors to the input signal voltage Vin1 (voltage at the first input voltage terminal) during a sampling phase and the input signal voltage Vin2 (voltage at the second input voltage terminal) during an amplification phase, are added to the sample-and-hold amplifier in FIG. 1. The other end of the input capacitor CIN1 is connected to the gate of the NMOS input transistor M1 and the other end of the input capacitor CIN2 is connected to the gate of the PMOS load transistor M2. Note that, in the circuit shown in FIG. 1, a voltage applied to the common connection point of the feedback capacitors CF1 and CF2 via the changeover switch SW2 during the sampling phase is set as the input signal voltage Vin. However, in the circuit shown in FIG. 3, because input signal voltages Vin1 and Vin2 are respectively applied to the input capacitors CIN1 and CIN2 via the switch SW4, the input voltage to the switch SW2 which is applied to the feedback capacitors CF1 and CF2 via the switch SW2 is set as a reference voltage Vref (voltage at the input voltage terminal) in order to distinguish from those input signal voltages Vin1, Vin2.

The connection state of the switches in FIG. 3 shows the state during the sampling phase, and all the switches are switched to an inversion state during the amplification phase. In this circuit, a quantity of electric charge Q1 stored in the capacitors CF1 and CIN1, and a quantity of electric charge Q2 stored in the capacitors CF2 and CIN2 during the sampling phase are given as equations (6) and (7). Here, Vgsn and Vgsp denote the gate-source voltages of the NMOS input transistor M1 and the PMOS load transistor M2.

$$Q1 = CIN1*(Vin1 - Vgsn) + CF1*(Vref - Vgsn) \quad (6)$$

$$Q2 = CIN2*(Vin1 - Vgsp) + CF2*(Vref - Vgsp) \quad (7)$$

Next, when the switches reach an inversion state during the amplification phase, the input voltage Vin2 is applied to the input capacitors CIN1 and CIN2, and the feedback capacitors CF1 and CF2 are connected to the inverter output terminal Aout. Given that a gate-source voltage of the NMOS input transistor M1 is Vgsn', a gate-source voltage of the PMOS load transistor M2 is Vgsp', a quantity of electric charge stored in the capacitors CF1 and CIN1 is Q1', and a quantity of electric charge stored in the capacitors CF2 and CIN2 is Q2' at this time, those are respectively expressed as equations (8) and (9).

$$Q1' = CIN1*(Vin2 - Vgsn') + CF1*(Vout - Vgsn') \quad (8)$$

$$Q2' = CIN2*(Vin2 - Vgsp') + CF2*(Vout - Vgsp') \quad (9)$$

Here Q1=Q1' and Q2=Q2' from the charge conservation law, and Vgsn=Vgsn' and Vgsp=Vgsp' under the assumption that the gain of the inverter is sufficiently high, equation (10) and equation (11) are derived, respectively, from equations (6) and (8) and equations (7) and (9). Consequently, the both equations (10) and (11) lead to the same as the equation (2) when a capacitance ratio sets to CIN1/CF1=CIN2/CF2=CIN/CF. Thus, an inverting charge amplifier circuit can be realized having the same functions as that of the circuit illustrated in the circuit diagram of FIG. 10

$$Vout=Vref-(Vin2-Vin1)*CIN1/CF1 \quad (10)$$

$$Vout=Vref-(Vin2-Vin1)*CIN2/CF2 \quad (11)$$

Further, a current to charge or discharge the load capacitance is the same as the equation (5) by reason that the feedback in the circuit of FIG. 3 is applied to the gate of the input transistor M1 via the feedback capacitor CF1 during the amplification phase in the same way as in the circuit of FIG. 1 and also the feedback is applied to the gate of the load transistor M2 via the feedback capacitor CF2. Consequently, a high-speed settling time can be realized because a current increases owing to a transconductance gmp of the load transistor M2. Additionally, the discharging current (by the input transistor M1 at fall) or the charging current (by the load transistor M2 at rise) is not limited to a constant upper value and increases according to the output swing even when output swing increases in a large output swing operation. Therefore, it is possible to realize an inverting charge amplifier circuit capable of having fast settling characteristics at both rise and fall without increasing bias current in a steady state.

Third Embodiment

Figure 4:
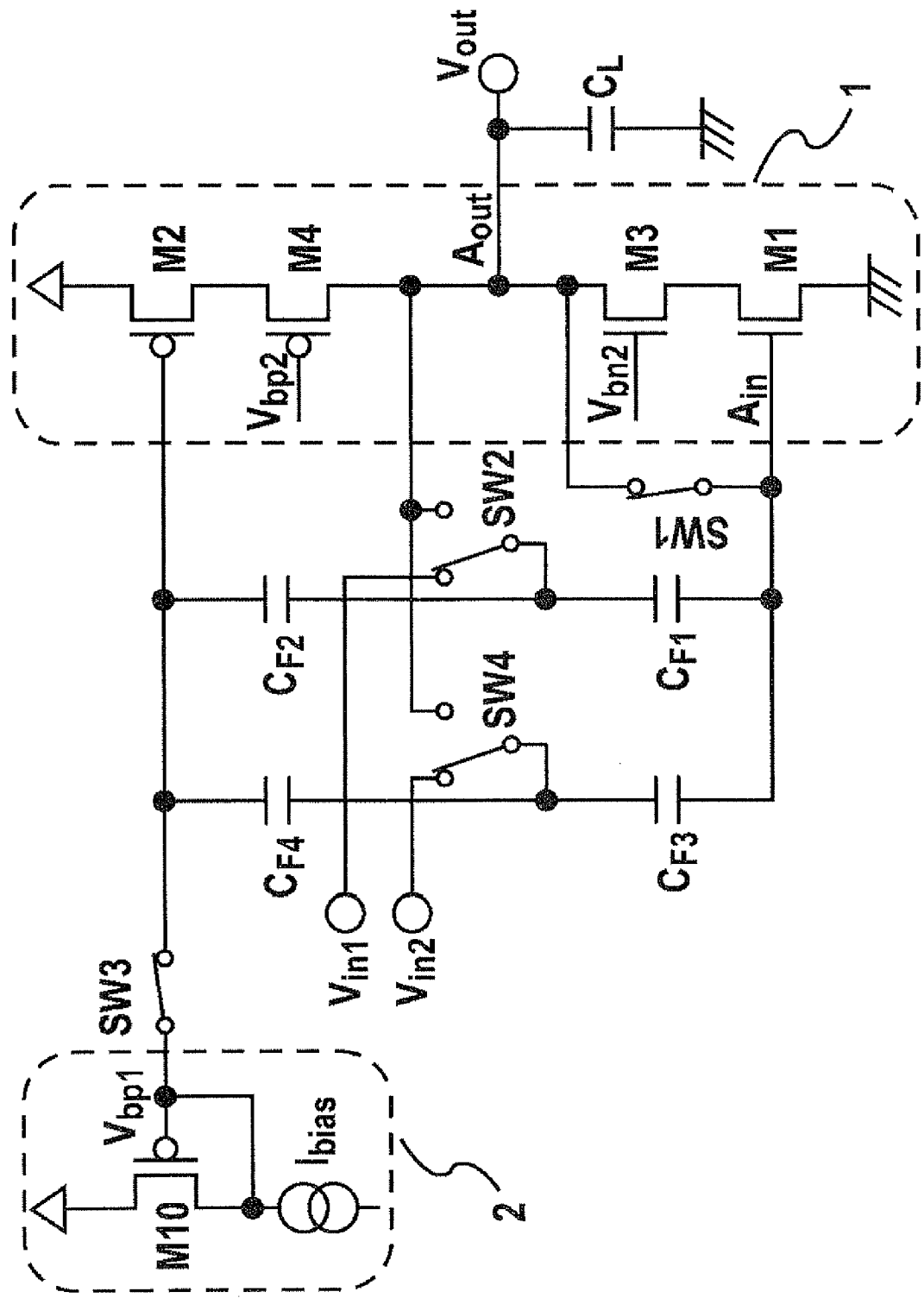
FIG. 4 is a circuit diagram showing a weighted mean sample-and-hold circuit, that is a third embodiment of the switched-capacitor circuit to which the present invention is applied.

The present invention can be applied to a switched-capacitor circuit serving as a weighted mean sample-and-hold circuit. FIG. 4 shows an embodiment in which the present invention is applied to a weighted mean sample-and-hold circuit as a third embodiment. FIG. 4 is a structure in which the connection of the changeover switch SW4 (the fourth switch) is merely changed from that of the inverting charge amplifier circuit of FIG. 3 such that the input capacitors CIN1 and CIN2 are connected to the inverter output Aout during the amplification phase, and the other basic components thereof are the same as those in FIG. 3. The input capacitors CIN1 and C1N2 of FIG. 3 are expressed as a CF3 (a third capacitor) and a CF4 (a fourth capacitor) in FIG. 4, because they operate as feedback capacitors during the amplification phase. Further, an input signal voltage applied to the capacitors CF1 and CF2 during the sampling phase is expressed as Vin1 (voltage at an input terminal) and an input signal voltage applied to the capacitors CF3 and CF4 is expressed as Vin2 (voltage at another input terminal). The connection state of the switches in FIG. 4 shows the state during the sampling phase, and all the switches are switched to an inversion state during the amplification phase.

In the same as in the second embodiment of FIG. 3, during the sampling phase, given that the quantity of charge stored in the feedback capacitors CF1 and CF3 is Q1, and the quantity of charge stored in the feedback capacitors CF2 and CF4 is Q2, and a gate-source voltage of the input transistor M1 is Vgsn and a gate-source voltage of the load transistor M2 is Vgsp, the quantity of charge Q1 and the quantity of charge Q2 are respectively expressed as equations (12) and (13).

$$Q1=CF1*(Vin1-Vgsn)+CF3*(Vin2-Vgsn) \quad (12)$$

$$Q2=CF2*(Vin1-Vgsp)+CF4*(Vin2-Vgsp) \quad (13)$$

The switches reach in an inverted connection state during the amplification phase, and both of the common connection point of the feedback capacitors CF1 and CF2 and the common connection point of the feedback capacitors CF3 and CF4 are connected to the inverter output terminal Aout. Given that a gate-source voltage of the input transistor M1 is Vgsn', a gate-source voltage of the load transistor M2 is Vgsp', the quantity of charge stored in the feedback capacitors CF1 and CF3 is Q1', and the quantity of charge stored in the feedback capacitors CF2 and CF4 is Q2', the quantities of charge Q1' and Q2' are respectively expressed as equations (14) and (15).

$$Q1'=CF1*(Vout-Vgsn')+CF3*(Vout-Vgsn') \quad (14)$$

$$Q2'=CF2*(Vout-Vgsp')+CF4*(Vout-Vgsp') \quad (15)$$

Here Q1=Q1' and Q2=Q2' from the charge conservation law and Vgsn=Vgsn' and Vgsp=Vgsp' under the assumption that the gain of the inverter is sufficiently high, equations (16) and (17) are derived, respectively, from equations (12) and (14) and equations (13) and (15). As is clear from equations (16) and (17), equations (16) and (17) are the same each other when a capacitance ratio is set to CF3/CF1=CF4/CF2. These equations denote that the output voltage is a weighted mean value in which the input voltage Vin1 and the input voltage Vin2 are respectively multiplied by the capacitance value CF1 and the capacitance value CF3 as weighting coefficients. Therefore, the circuit structure of FIG. 4 becomes a weighted mean sample-and-hold circuit.

$$Vout=Vin1*CF1/(CF1+CF3)+Vin2*CF3/(CF1+CF3) \quad (16)$$

$$Vout=Vin1*CF2/(CF2+CF4)+Vin2*CF4/(CF2+CF4) \quad (17)$$

In the circuit of FIG. 4, feedback is applied to the gate voltage of the input transistor M1 via the feedback capacitors CF1 and CF3 during the amplification phase, and feedback is applied to the gate voltage of the load transistor M2 via the feedback capacitors CF2 and CF4 as well in the same way as in the circuit of FIG. 3, and therefore, a high-speed settling characteristics can be realized. Further, the discharging current by the input transistor M1 at fall or the charging current by the load transistor M2 at rise is not limited to a constant upper limit and increases according to the output swing even when output swing increases in a large output swing operation. Therefore, a fast settling time is possible at both rise and fall without increasing bias current in a steady state, which makes it possible to realize a high-speed weighted mean sample-and-hold circuit without increasing bias current. This circuit can be applied to a digital-to-analog converter by increasing the number of feedback capacitor pairs and the number of switches for input signals in the same way.

Fourth Embodiment

Figure 5:
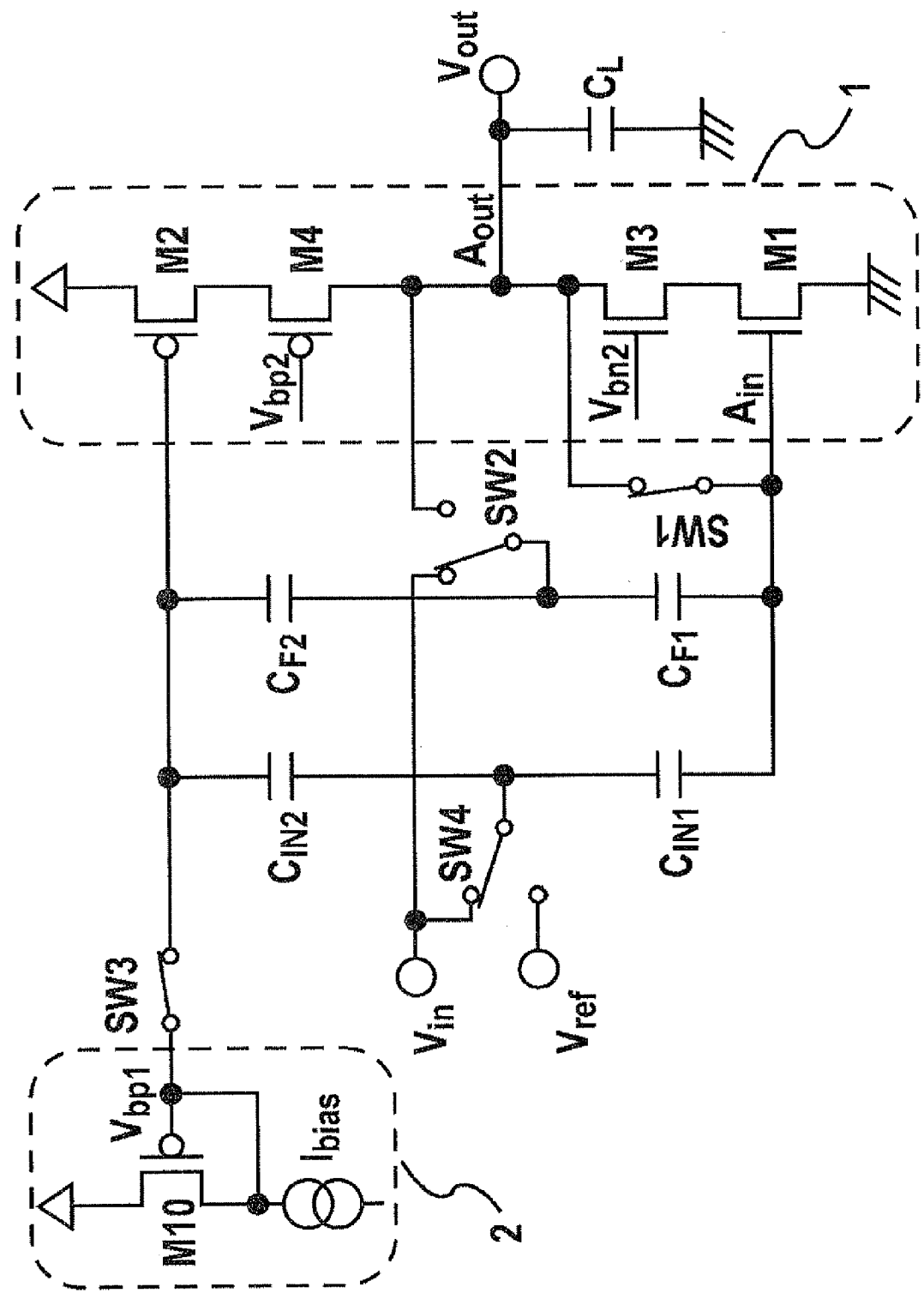
FIG. 5 is a circuit diagram showing a circuit to execute non-inverting amplification of a signal input, that is a fourth embodiment of the switched-capacitor circuit to which the present invention is applied.

The present invention can be applied to an amplifier circuit that executes non-inverting (positively) amplification of an input signal voltage, which is used for a pipeline analog-to-digital converter, and FIG. 5 shows a circuit diagram thereof as a fourth embodiment. Basically, the circuit is composed of the same components in FIG. 3, and connecting points (voltages) to which the changeover switches SW2 (the second switch) and SW4 (the fourth switch) are connected are merely changed. In FIG. 5, an input voltages of the switch SW2 and the switch SW4 are set as a common input signal voltage Vin (voltage at the input terminal) during the sampling phase, and a voltage applied to the input capacitors CIN1 and CIN2 via the switch SW4 during the amplification phase is set as Vref (a ground voltage or a reference voltage). Accordingly, the output voltage of FIG. 5 is derived from equations (18) and (19) when the voltages are replaced as Vref=Vin, Vin=Vin, and Vin2=Vref in equations (11) and (12). Here, equations

(18) and (19) become the same each other when a capacitance ratio is set to CIN1/CF1=CIN2/CF2=CIN/CF and it is clear that the output voltage Vout has a value that the input signal voltage Vin is amplified (1+CIN/CF) times by non-inverted (positively) amplification.

$$Vout=Vin*(1+CIN1/CF1)-Vref*CIN1/CF1 \quad (18)$$

$$Vout=Vin*(1+CIN2/CF2)-Vref*CIN2/CF2 \quad (19)$$

In the circuit of FIG. 5 feedback is applied to the gate voltage of the input transistor M1 via the feedback capacitor CF1 during the amplification phase, and feedback is applied to the gate voltage of the load transistor M2 via the feedback capacitor CF2 as well in the same way as in the circuit of FIG. 3, and therefore, a high-speed settling can be realized. Further, discharging current by the input transistor M1 at fall or the charging current by the load transistor M2 at rise increases according to the output swing without a constant upper limit even when the output swing increases in a large output swing operation. Therefore, a fast settling time is possible at both rise and fall without increasing bias current in a steady state, which makes it possible to realize the object of the present invention. The circuit of FIG. 5 can be configured such that the reference voltage Vref connected to the input capacitors during the amplification phase is selected from several voltage values depending on signal voltages, which can be applied to a pipeline analog-to-digital converter.

Fifth Embodiment

Figure 6:
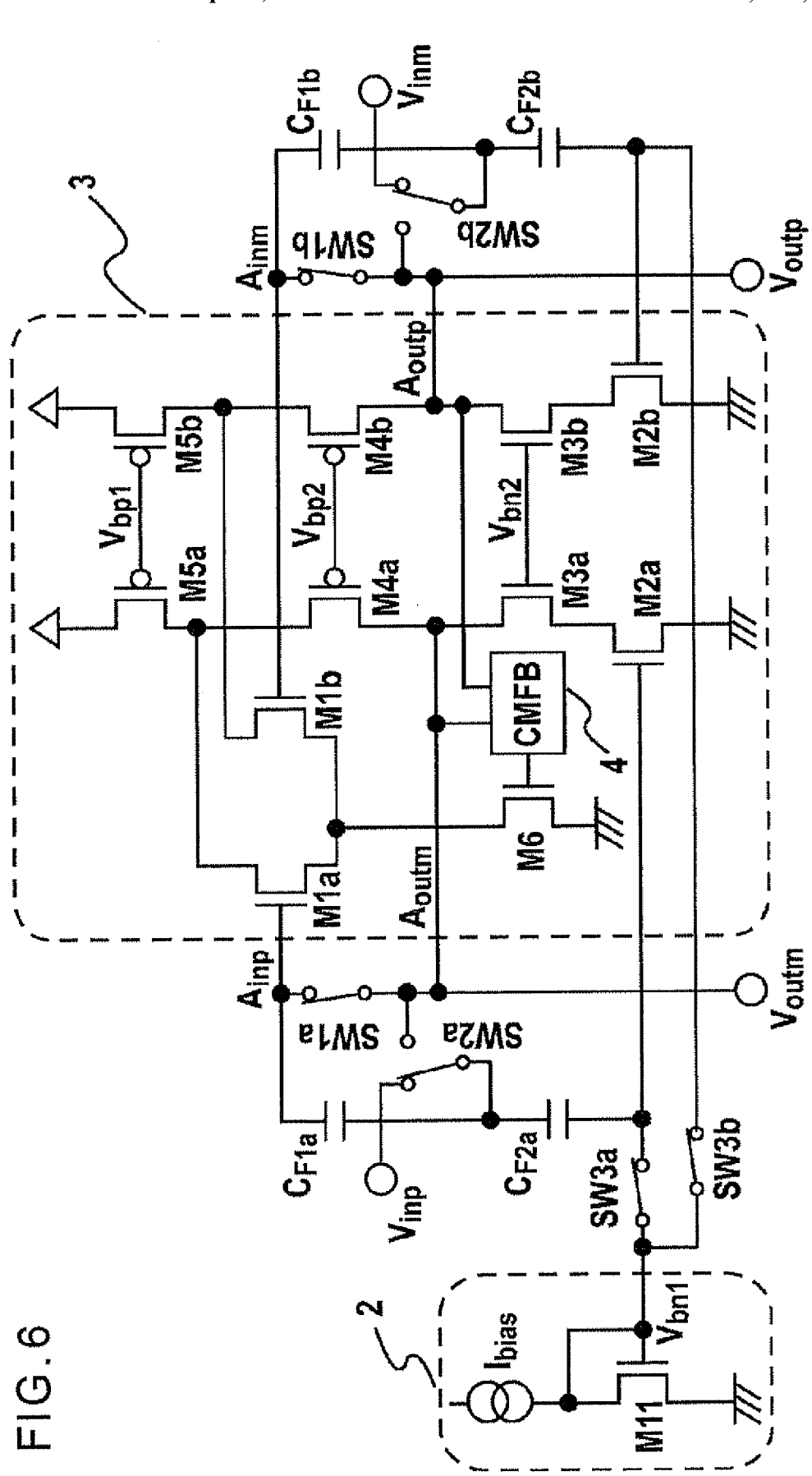
FIG. 6 is a circuit diagram showing a sample-and-hold amplifier, that is a fifth embodiment of a switched-capacitor circuit having a fully differential structure to which the present invention is applied.

In all the above-described embodiments, the single-end cascode inverter with one input and one output, which is composed of the NMOS transistors M1 and M3 and the PMOS transistors M2 and M4, has been used. However, the present invention can be applied to a switched-capacitor circuit using a fully differential opamp (operational amplifier) with two inputs and two outputs. FIG. 6 shows a fully differential circuit as a fifth embodiment to which the sample-and-hold amplifier shown in FIG. 1 is applied.

FIG. 6 shows a fully differential sample-and-hold amplifier in which a fully differential opamp 3 with two inputs and two outputs are used instead of the inverter in the sample-and-hold amplifier shown in FIG. 1 in order to extend input and output signals to a differential signal. First ends of first feedback capacitors CF1a and CE1b and one end of switches SW1a and SW1b whose other ends are connected to opamp output terminals Aoutm and Aoutp are respectively connected to input terminals Ainp and Ainm of the fully differential opamp 3. First ends of second feedback capacitors CF2a and CF2b are connected to the other ends of the feedback capacitors CF1a and CF1b, and switches SW2a and SW2b that connect input voltages Vinp and Vinm during the sampling phase and connect the fully differential opamp output terminals Aoutm and Aoutp during the amplification phase are connected to the other ends of the feedback capacitors CF1a and CF1b. The other ends of the second feedback capacitors CF2a and CF2b are connected to the gates of the NMOS transistors M2a and M2b operating as load transistors, which are components of the opamp 3. These circuit configurations are extended to be a structure in which all the capacitors and the switches shown in FIG. 1 are provided two by two to be symmetrically disposed in connections to the fully differential op amp 3 with two inputs and two outputs, and corresponding components have the same effects as those in FIG. 1.

As the opamp 3 in FIG. 6, a folded-cascode fully differential opamp is used as one example. This fully differential opamp is composed of input transistors M1a and M1b having differential structures in which the sources are connected in common and the gates serve as differential input terminals Ainp and Ainm, an NMOS transistor M.6 which is connected to the common source of the input transistors M1a and M1b to operate as a current source, PMOS constant current transistors M5a and M5b which are connected to drain terminals of input transistors M1a and M1b and in which the bias voltage Vbp1 are applied to their gates in order to turn back and transmit signal currents generated in the input transistors M1a and M1b according to input voltages, NMOS load transistors M2a and M2b that operate as a load, NMOS transistors M3a and M3b which are cascode-connected to input transistors M2a and M2b and in which bias voltage Vbn2 is applied to their gates in order to increase the drain resistances thereof, and PMOS transistors M4a and M4b which are cascode-connected to PMOS transistors M5a and M5b and in which bias voltage Vbp2 is applied to their gates.

The opamp 3 has a common-mode feedback circuit 4 built-in, for operating in such a way that an average value ((Voutm+Voutp)/2 of the output voltages Voutm and Voutp at the opamp output terminals Aoutm and Aoutp is in proximity to a common-mode voltage Vcom. The common-mode feedback circuit 4 is connected such that feedback is applied to the gate of the transistor M6 from the opamp output terminals Aoutm and Aoutp. Further, the gates of the NMOS load transistors M2a and M2b are connected to a bias circuit 2 at the bias voltage Vbn1 via the switches SW3a and SW3b during a sampling phase, and the load transistors M2a and M2b operate as constant current sources. These gates are disconnected from the bias circuit due to the fact that the switches SW3a and SW3b are turned off during an amplification phase and in place of those, the other ends of the feedback capacitors CF2a and CF2b are connected to the output terminals Aoutm and Aoutp, therefore the feedback from the output terminals is applied to the gates of the load transistors M2a and M2b via these feedback capacitors.

The fully differential sample-and-hold amplifier of FIG. 6 is operating in the extension mode using a differential signal on the basis of the operation of the circuit shown in FIG. 1. Because the input and output terminals of the opamp 3 are short-circuited by the switches SW1a and SW1b during the sampling phase, the voltages at the opamp input terminals Ainp and Ainm are set to the common-mode voltage Vcom by the common-mode feedback circuit 4, and the gate voltages at the load transistors M2a and M2b come to the bias voltage Vbn1. With reference to those voltages, the input signal voltage Vinp is sampled in the feedback capacitors CF1a and CF2a, and the input signal voltage Vinm is sampled in the feedback capacitors CF1b and CF2b.

During the amplification phase, when the gain of the opamp 3 is sufficiently high, the gate voltages at the load transistors M2a and M2b in a steady state hardly change from the bias voltage Vbn1 during the sampling phase. At this time, in a case of an average value of the differential input signals is the common-mode voltage Vcom, that is (Vinp+Vinm)/2=Vcom, the voltages at the opamp input terminals Ainp and Ainm are not changed from that during the sampling phase to come to the common-mode voltage Vcom, and the output voltages respectively come to Voutm=Vinp and Voutp=Vinm from the charge conservation law.

Further, when (Vinp+Vinm)/2=Vcom is not established, this means that an average value of the differential input signals is different from the common-mode voltage Vcom, the input terminal voltages at Ainp and Ainm during the amplification phase fluctuate from the voltage value Vcom during the sampling phase, operating so as to be (Voutp+

Voutm)/2=Vcom. This operation causes the difference between Voutm and Vinp as well as the difference between Voutp and Vinm. (namely, Voutm is not equal to Vinp. Voutp is not equal to Vinm.) However, the voltages at the two input terminals Ainp and Ainm are the same voltage value, and a differential output voltage value Voutm−Voutp coincides with Vinp−Vinm that is a differential input voltage value during the sampling time, that is Voutm−Voutp=Vinp−Vinm. In this way, in the sample-and-hold amplifier having a fully differential structure of FIG. 6, a differential input signal Vinp−Vinm input during the sampling phase is output as a differential output signal Voutm−Voutp=Vinp−Vinm during the amplification phase. The sample-and-hold amplifier having a fully differential circuit structure has the feature that individual voltage values themselves at Vinp and Vinm are not held, but a differential voltage Vinp−Vinm are held, and then, Voutm and Voutp which are symmetrical output voltage values centering on the common-mode voltage Vcom are output during the amplification phase, so as to be (Voutp+Voutm)/2=Vcom with the above differential voltage held constant.

In the fully differential sample-and-hold amplifier as well, the driving current at the output terminals Voutm and Voutp to charge or discharge the load capacitances during the amplification phase is produced, in the same way as the sample-and-hold amplifier in FIG. 1, by an amount of fluctuation in the current at the input transistors M1*a* and M1*b* via the feedback capacitors CF1*a* and CF1*b*, and this is also produced by an amount of fluctuation in the current at the load transistors M2*a* and M2*b* via the feedback capacitors CF2*a* and CF2*b*. Therefore, there is an additive effect due to the fact that the feedback is applied to the gates of the load transistors, and the driving current to charge or discharge the load capacitances increases, which makes it possible to realize a high-speed settling time.

In a typical circuit structure, the gate voltages of the load transistors M2*a* and M2*b* in FIG. 6 continue to be connected to the bias circuit even during the amplification phase, and then, the sink current at the output terminal is limited by the constant current Iconst flowing in the transistors M2*a* and M2*b*, and it slows down especially at fall in case of a large output swing due to a slew rate region operation. However, as in the structure shown in FIG. 6, by disconnecting the load transistors M2*a* and M2*b* from the bias circuit 2, the sink current increases to 2*Iconst that is a doubled current due to the effect of the feedback capacitors CF2*a* and CF2*b*. Therefore, it is possible to realize a relatively high-speed settling time even in a failing characteristic in case of a large output swing. Usually, in a fully differential opamp circuit, one of the two outputs rises up, and the other one falls down. Therefore, its sampling cycle is limited by a slower settling characteristic. However, because high-speed settling characteristics is obtained at both rise and fall even in case of a large output swing by using the present invention, a higher sampling frequency is possible even under a same bias current.

As the described above, the present invention can be applied to a fully differential sample-and-hold amplifier as well, and the switched-capacitor circuit with various functions shown in FIGS. 3, 4, and 5 can be extended to be a fully differential circuit in the same as the circuit shown in FIG. 6. In the fully differential various switched-capacitor circuits to which the present invention is applied in this way, it is possible to realize a settling time faster than that in the conventional circuit structure. There is an effect that settlings at rise and fall are made equally faster especially in case of a large output swing, and the object of the present invention can be achieved by extending the circuit to be a circuit having a fully differential structure.

Sixth Embodiment

Figure 7:
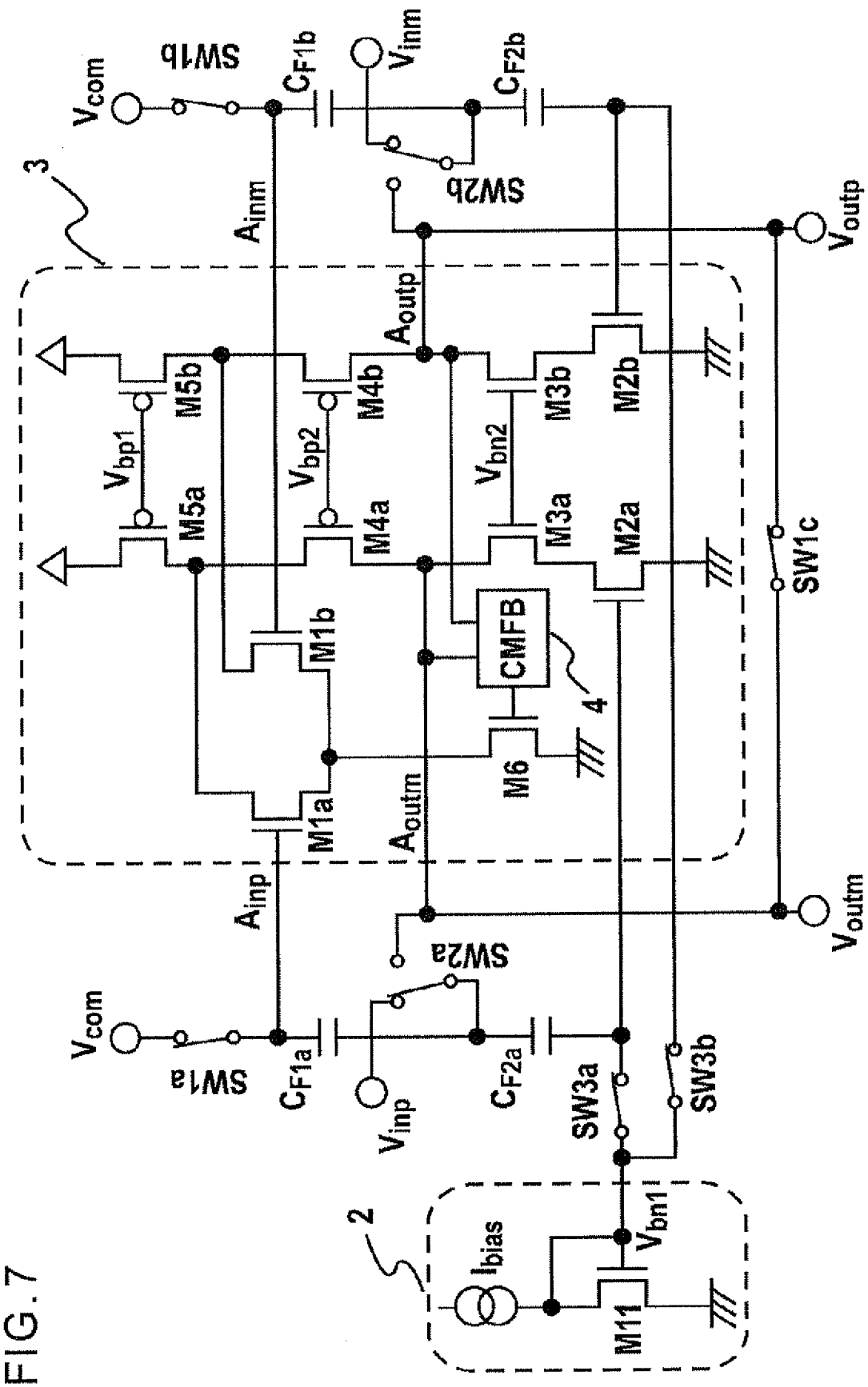
FIG. 7 is a circuit diagram showing a sample-and-hold amplifier having a fully differential structure, that is a sixth embodiment in which the structure concerning the switches shown in FIG. 6 is changed.

In all the above-described embodiments, the switch SW1 or the SW1*a* and SW1*b* applies an initial voltage to the terminal of the first feedback capacitor connected to the opamp input by connecting the other ends of these switches to the opamp output terminals during the sampling phase, and then, the opamp itself drives the first feedback capacitor during the sampling phase. However, these switches are not necessarily provided between the inputs and outputs of the opamp. For example, it is possible to apply the initial voltage from a voltage source having voltage output corresponding to an input voltage of the opamp. In particular, in a fully differential circuit structure, because all the input and output terminal voltages of the opamp during the sampling time come to the common-mode voltage Vcom, a structure in which the voltage Vcom is applied to the feedback capacitors and the input capacitors independently of the opamp during the sampling phase can be used. FIG. 7 shows a circuit structure in which an initial voltage is applied to the first feedback capacitors CF1*a* and CF1*b* from a voltage source circuit that outputs the common-mode voltage Vcom as a sixth embodiment.

In FIG. 7, the switches SW1*a* and SW1*b* whose one ends are connected to the opamp input terminals Ainp and Ainm are connected to a constant voltage circuit at the common-mode voltage Vcom with their other end, and during the sampling time, the voltage value Vcom (voltage at the first voltage terminal) is applied as an initial voltage to one ends (first terminals) of the feedback capacitors CF1*a* and CF1*b* (first capacitors) directly from the voltage terminal Vcom, and the output terminals Aoutm and Aoutp are short-circuited by a switch SW1*c*. This switch SW1*c* is provided such that operating points of the output voltages do not deviate from normal operating points although there are characteristic variations between circuit elements in the right portion and in the left portion.

As is clear in comparison with FIG. 6, the embodiment is different only in the points of the connections of the switches SW1*a* and SW1*b* and the addition of the switch SW1*c* (the structure of the first switch), and the other structure is the same as that of FIG. 6. Here, the connection form of the switches in FIG. 7 is different from that in FIG. 6, but the operation thereof is the same, because all the input and output terminal voltages of the opamp 3 during the sampling phase are set to the common-mode voltage Vcom. The advantage in this structure has a possibility that the power consumption is suppressed depending on a structure of a constant voltage circuit that outputs Vcom, because there is no need for the opamp 3 itself to apply an initial voltage to the feedback capacitors CF1*a* and CF1*b*.

The circuit structure of FIG. 7 is different in the way of applying a voltage to the feedback capacitors during the sampling phase, and the operation during the amplification phase is completely the same as that in the circuit of FIG. 6. Thus, in the same way as the circuit of FIG. 6, the circuit structure of FIG. 7 has the feature that it is possible to realize high-speed setting characteristics at both rise and fall, and the object of the present invention can be achieved in such a circuit structure as well. Note that the above fully differential circuit structure as shown in FIG. 7 is one example in case that a voltage source circuit that generates a voltage value which is the same as an opamp input voltage is provided, however, the equivalent circuit structure can also be configured in principle by using the single-end inverter shown in FIGS. 1, 3, 4, and 5 and connecting the switch SW1 between this inverter input terminals and the voltage source circuit.

What is claimed is:

1. A switched-capacitor circuit for performing a two-phase operation, including a sampling phase and an amplification phase, said switched-capacitor circuit comprising:

an inverter with an input and an output, having a common source input transistor and a load transistor connected in series together, a gate of an input transistor serving as the input of the inverter, a node between the input transistor and the load transistor serving as the output of the inverter;

a first capacitor whose first terminal is connected to the input of the inverter;

a first switch which is controlled so as to connect the input of the inverter to the output of the inverter during the sampling phase, and which is controlled so as to disconnect the input of the inverter from the output of the inverter during the amplification phase;

a second switch which is controlled to connect a second terminal of the first capacitor to an input voltage terminal which is supplied with an input voltage during the sampling phase, and which is controlled to connect a second terminal of the first capacitor to the output of the inverter during the amplification phase;

a second capacitor with a first terminal is connected to a gate of the load transistor of the inverter and with a second terminal is connected to the second terminal of the first capacitor; and a third switch which is controlled so as to connect the gate of the of the load transistor to be supplied with a bias voltage during the sampling phase, and which is controlled so as to interrupt supply of the bias voltage to the gate of the load transistor during the amplification phase.

2. The switched-capacitor circuit according to claim 1 further comprising:

a fully differential operational amplifier with two inputs and two outputs including a pair of inverters consisting of two input transistors whose sources are connected in common and which has two load transistors, a transistor which is connected to the common source of the two input transistors to operate as a current source, and an internal common-mode feedback circuit which controls to adjust the average value of the two output voltages at the two load transistors to approximately to a common-mode voltage, and a pair of sets, each set including the first capacitor, the second capacitor, the first switch, the second switch and the third switch, wherein the pair of sets are symmetrically disposed in connections with the pair of inverters to form a fully differential structure.

3. The switched-capacitor circuit according to claim 1, further comprising:

a third capacitor having a first terminal connected to the first terminal of the first capacitor;

a fourth capacitor having a first terminal connected to the first terminal of the second capacitor; and a fourth switch which is controlled to connect second terminals of the third capacitor and the fourth capacitor in common to a first input voltage terminal which is supplied with a first input voltage during the sampling phase, and to a second input voltage terminal which is supplied with a second input voltage during the amplification phase;

the switched-capacitor circuit operates as an inverting charge amplifier circuit for a differential voltage between a voltage at the first input voltage terminal and a voltage at the second input voltage terminal by using a voltage at the input voltage terminal as a reference voltage.

4. The switched-capacitor circuit according to claim 1, further comprising:

a third capacitor having a first terminal connected to the first terminal of the first capacitor;

a fourth capacitor having a first terminal connected to the first terminal of the second capacitor; and a fourth switch which is controlled to connect second terminals of the third capacitor and the fourth capacitor in common to another input voltage terminal which is supplied with another input voltage during the sampling phase, and to the output terminal of the inverter during the amplification phase, the switched-capacitor circuit operates as a weighted mean sample-and-hold circuit for a voltage at the input voltage terminal and a voltage at the another input voltage terminal.

5. The switched-capacitor circuit according to claim 1, further comprising:

a third capacitor having a first terminal connected to the first terminal of the first capacitor;

a fourth capacitor having a first terminal connected to the first terminal of the second capacitor; and a fourth switch which is controlled to connect second terminals of the third capacitor and the fourth capacitor in common to the input voltage terminal during the sampling phase, and to a ground terminal or a reference voltage terminal which is supplied with a reference voltage during the amplification phase, the switched-capacitor circuit operates as a circuit that positively amplifies a voltage at the input voltage terminal.

* * * * *